(12) United States Patent
Chang et al.

(10) Patent No.: US 12,453,127 B2
(45) Date of Patent: Oct. 21, 2025

(54) METHODS OF MANUFACTURING SEMICONDUCTOR DEVICES AND SEMICONDUCTOR DEVICES

(71) Applicant: TAIWAN SEMICONDUCTOR MANUFACTURING COMPANY, LTD., Hsinchu (TW)

(72) Inventors: Che-Lun Chang, Hsinchu (TW); Kuan-Ting Pan, Taipei (TW); Wei-Yang Lee, Taipei (TW); Chia-Pin Lin, Xinpu Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 689 days.

(21) Appl. No.: 17/842,595

(22) Filed: Jun. 16, 2022

(65) Prior Publication Data

US 2023/0411481 A1 Dec. 21, 2023

(51) Int. Cl.
*H10D 30/67* (2025.01)
*H10D 30/01* (2025.01)
*H10D 62/10* (2025.01)
*H10D 84/01* (2025.01)
*H10D 84/03* (2025.01)

(52) U.S. Cl.
CPC ....... *H10D 30/6735* (2025.01); *H10D 30/031* (2025.01); *H10D 30/6713* (2025.01); *H10D 30/6757* (2025.01); *H10D 62/115* (2025.01); *H10D 62/121* (2025.01); *H10D 84/0128* (2025.01); *H10D 84/013* (2025.01); *H10D 84/0151* (2025.01); *H10D 84/038* (2025.01)

(58) Field of Classification Search
CPC .................................................. H10D 30/6735
See application file for complete search history.

(56) References Cited

U.S. PATENT DOCUMENTS

| | | | |
|---|---|---|---|
| 9,236,267 B2 | 1/2016 | De et al. |
| 9,502,265 B1 | 11/2016 | Jiang et al. |
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |

(Continued)

*Primary Examiner* — Ajay Ojha
*Assistant Examiner* — Hajar Kolahdouzan
(74) *Attorney, Agent, or Firm* — STUDEBAKER BRACKETT PLLC

(57) ABSTRACT

In a method of manufacturing a semiconductor device, a fin structure in which first semiconductor layers and second semiconductor layers are alternately stacked is formed over a substrate, a sacrificial gate structure is formed over the fin structure, a source/drain region of the fin structure is etched thereby forming a source/drain space, ends of the first semiconductor layers is laterally etched, an insulating layer is formed on a sidewall of the source/drain space, the insulating layer is partially etched, thereby forming one or more inner spacers on an etched end face of each of one or more first semiconductor layers and leaving a part of the insulating layer as a remaining insulating layer, and a source/drain epitaxial layer is formed in the source/drain space. After the source/drain epitaxial layer is formed, an end face of at least one of the second semiconductor layers is covered by the remaining insulating layer.

20 Claims, 17 Drawing Sheets

(56) References Cited

U.S. PATENT DOCUMENTS

| | | |
|---|---|---|
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 2023/0343823 A1* | 10/2023 | Baek .................. H10D 30/43 |

* cited by examiner

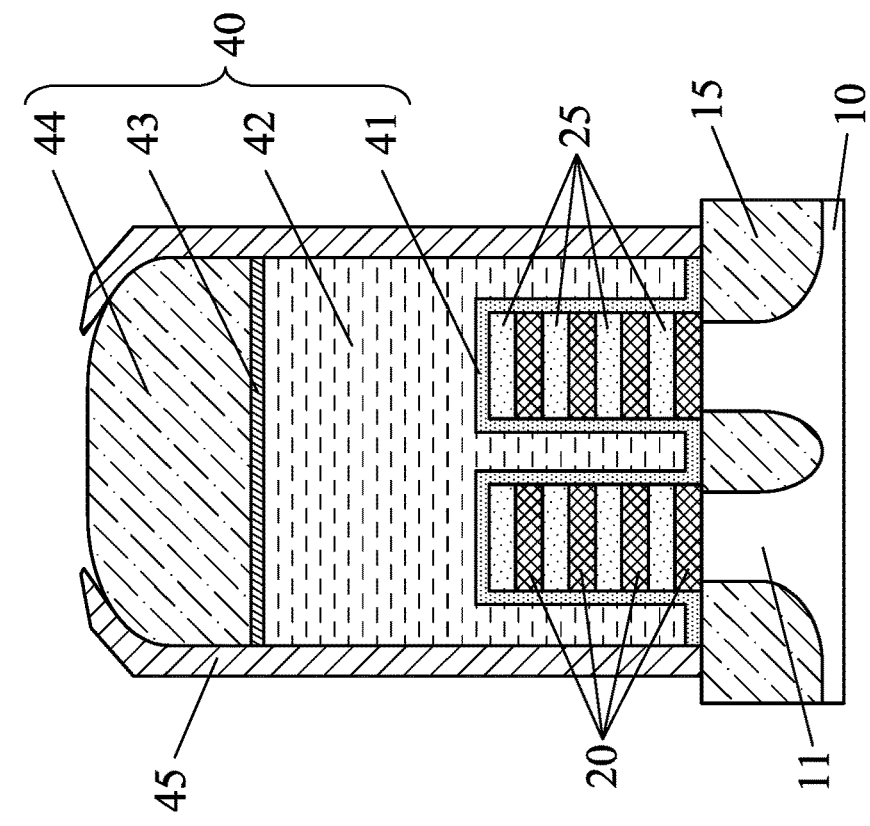
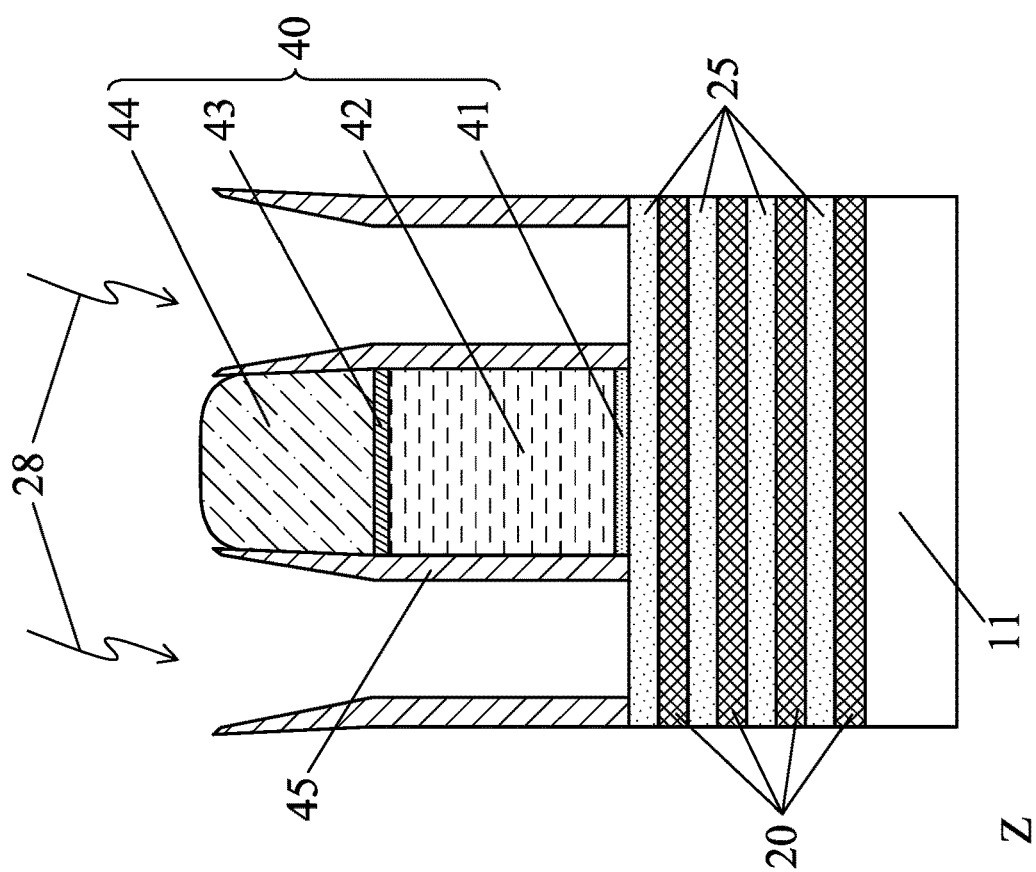
FIG. 5B
FIG. 5A

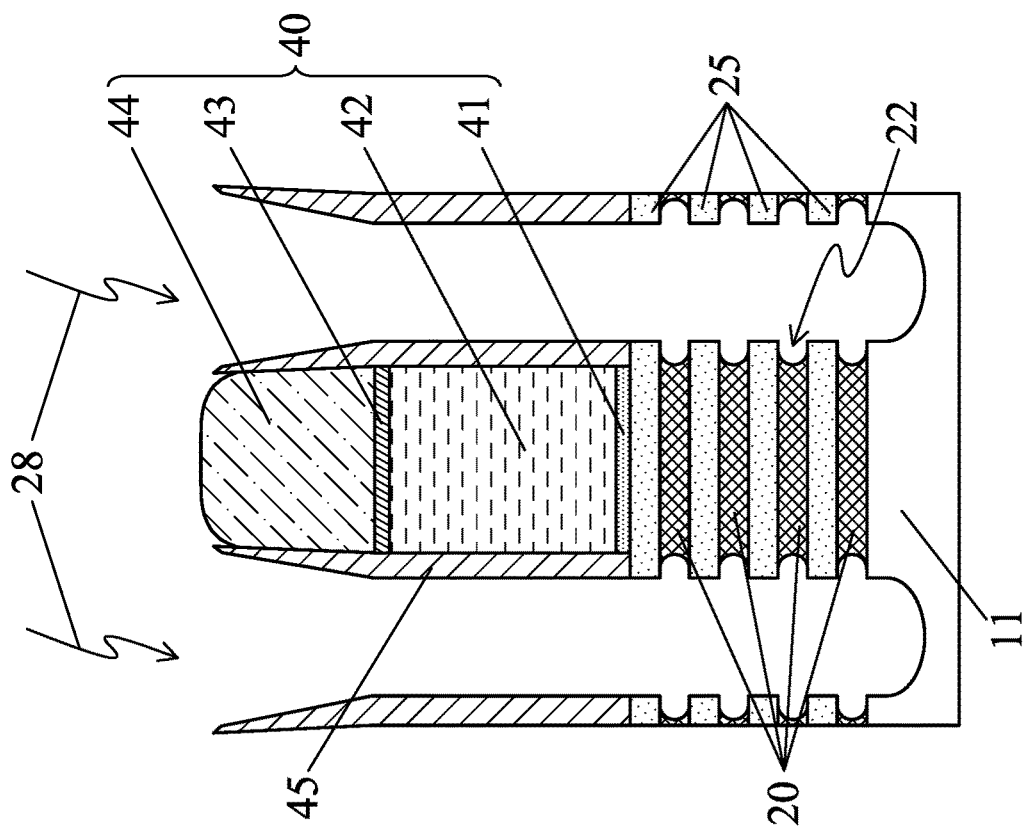
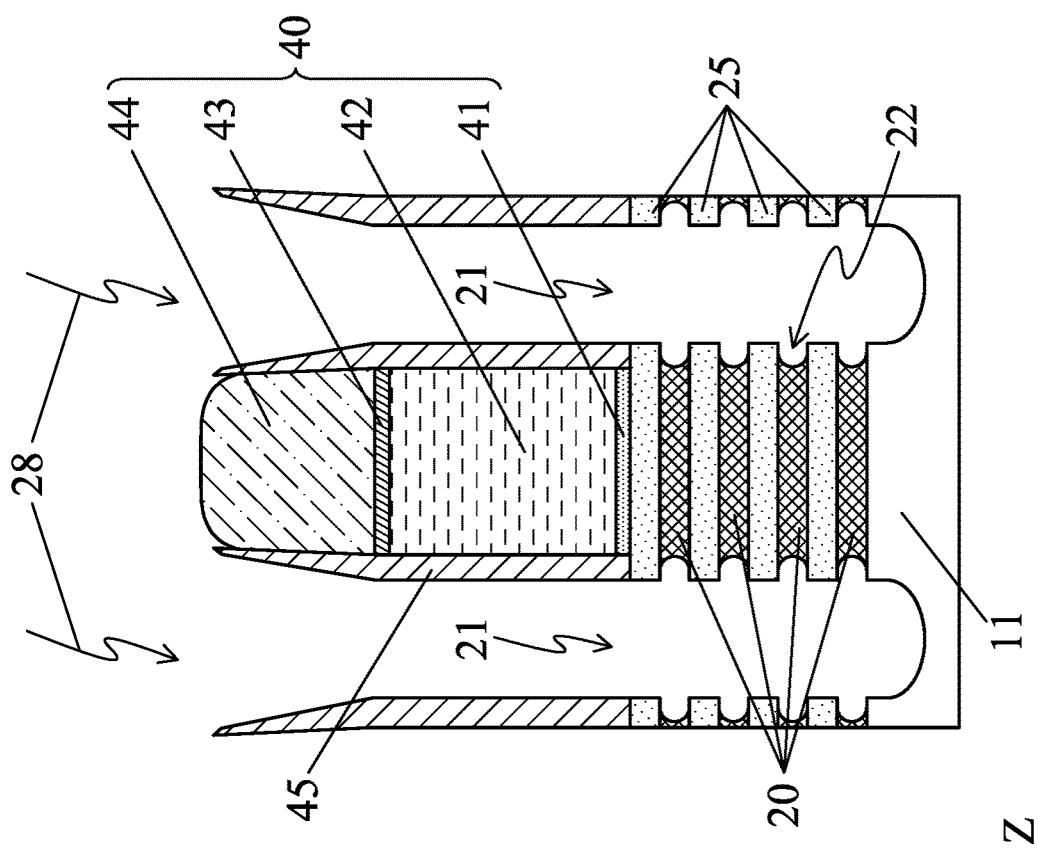
FIG. 8A
FIG. 8B

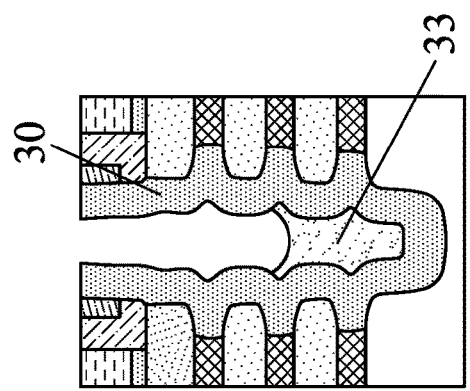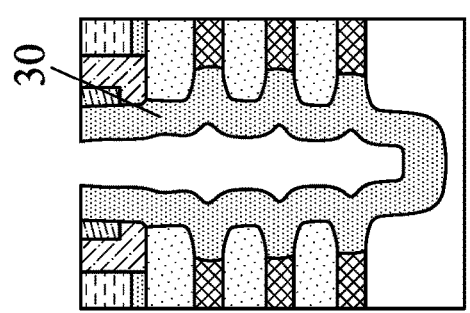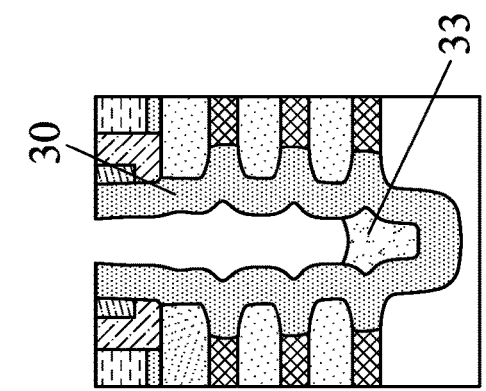
FIG. 15A  FIG. 16A  FIG. 17A
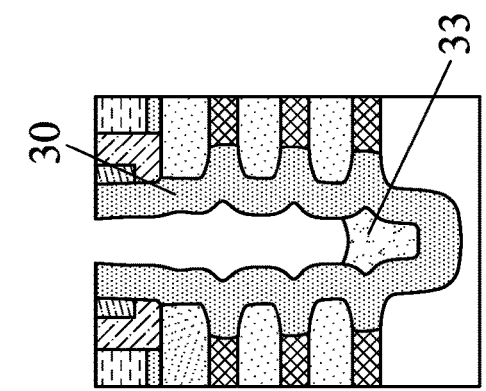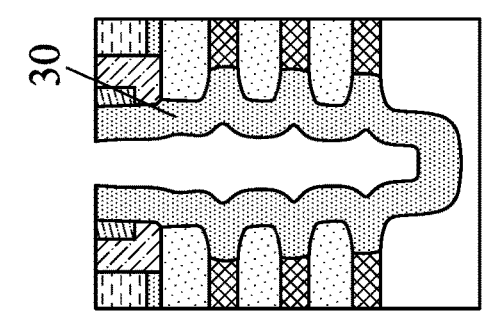
FIG. 15B  FIG. 16B  FIG. 17B

METHODS OF MANUFACTURING SEMICONDUCTOR DEVICES AND SEMICONDUCTOR DEVICES

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (FinFET) using a fin structure as a channel region and a gate-all-around (GAA) FET using multiple nano sheets or nano wires as a channel region.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A

FIGS. 5A and 5B show one of the various stages of a sequential manufacturing process of a semiconductor GAA FET device according to an embodiment of the present disclosure.

FIGS. 8A and 8B show one of the various stages of a sequential manufacturing process of a semiconductor GAA FET device according to an embodiment of the present disclosure.

FIGS. 15A and 15B show one of the various stages of a sequential manufacturing process of a semiconductor GAA FET device according to an embodiment of the present disclosure.

FIGS. 16A and 16B show one of the various stages of a sequential manufacturing process of a semiconductor GAA FET device according to an embodiment of the present disclosure.

FIGS. 17A and 17B show one of the various stages of a sequential manufacturing process of a semiconductor GAA FET device according to an embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described. In the present disclosure, a source and a drain are interchangeably used and may be referred to as a source/drain.

Optimizing a driving electrical current (on-current) of a semiconductor FET device is one of the key technologies in advanced semiconductor devices. The on-current generally depends on a width of the channel region under a gate electrode. In the case of a FinFET, the on-current also depends on a height of the channel region of the fin structure, and in the case of a GAA FET, the on-current also depends on the thickness of each nano sheets or nano wires and the number of nano sheets or wires.

In the present disclosure, a semiconductor device including two or more types of GAA FETs having different numbers of nano sheets or nano wires and a manufacturing method thereof are proposed.

Figure 1A:
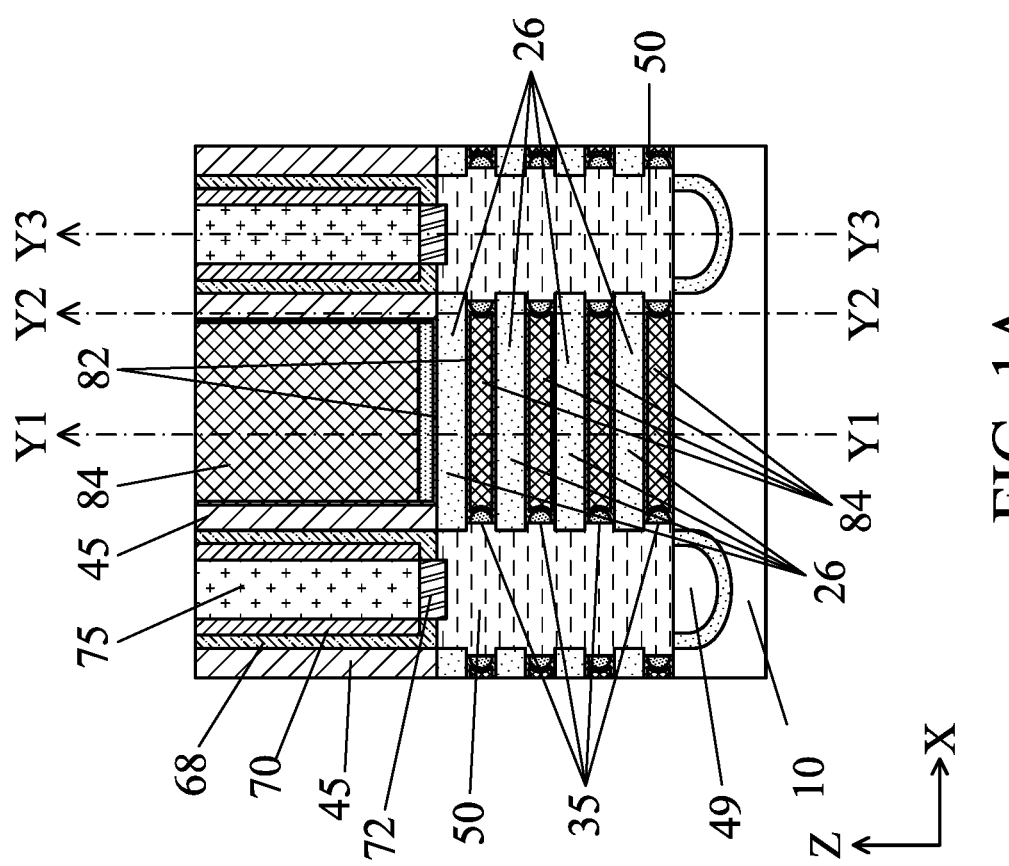
FIGS. 1A, 1B, 1C, and 1D show various views of a semiconductor FET device.
Figure 1D:
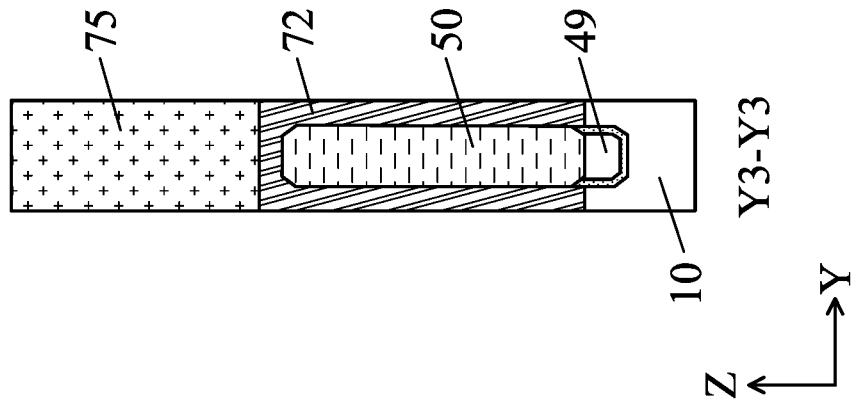
Figure 1C:
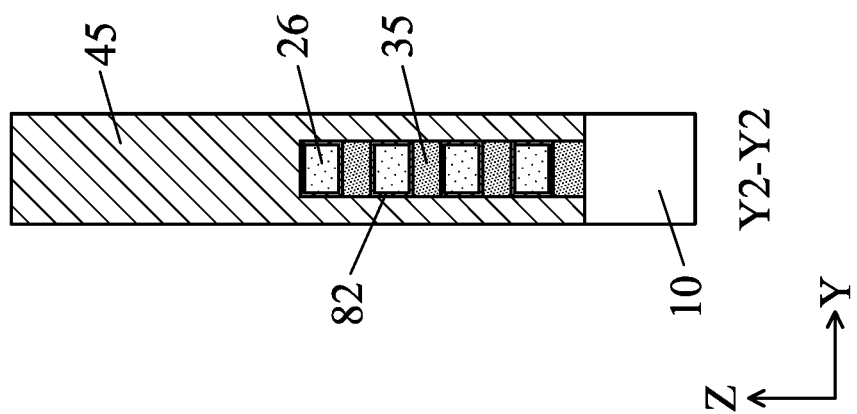
Figure 1B:
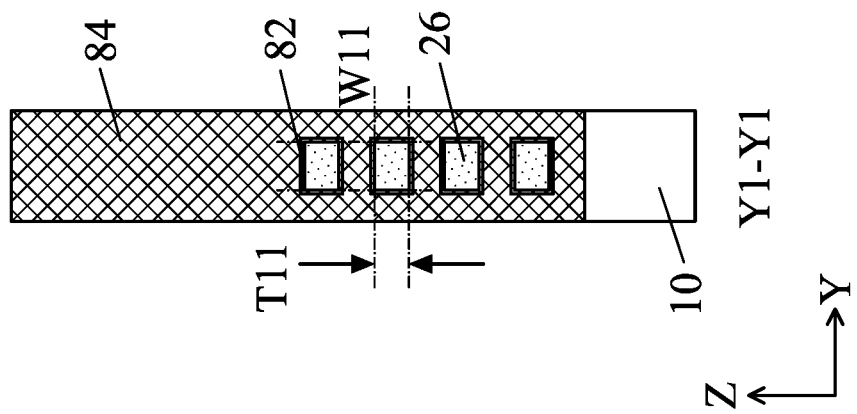

FIGS. 1A, 1B, 1C, and 1D show various views of a semiconductor GAA FET device according to an embodiment of the present disclosure. FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A. In some embodiments, the semiconductor GAA FET device of FIGS. 1A, 1B, 1C, and 1D is either a p-type FET or an n-type FET.

As shown in FIGS. 1A, 1B, and 1C, channel region 26, which are semiconductor nano sheets or nano wires (nano structures), are provided over a semiconductor substrate 10, and vertically arranged along the Z direction (the normal direction to the principal surface of the substrate 10). In some embodiments, the substrate 10 includes a single crystalline semiconductor layer on at least its surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain region. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 includes silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

As shown in FIGS. 1A, 1B, and 1C, the semiconductor nano wires or sheets (collectively nano-structures), which constitute channel regions 26, are disposed over the substrate 10. In some embodiments, the channel regions 26 are disposed over a base portion 11 (bottom fin structure) of a fin structure (see, FIG. 3) protruding from the substrate 10. Each of the channel regions 26 is wrapped around by a gate dielectric layer 82 and a gate electrode layer 84. The thickness T11 of the channel regions 26 is in a range from about 5 nm to about 60 nm and the width W11 of the channel regions 26 is in a range from about 5 nm to about 120 nm in some embodiments. In some embodiments, the width W11 of the channel regions 26 is greater than 120 nm. In certain embodiments, the width W11 is up to twice or five times the thickness T11 of the channel regions 26. In some embodiments, the channel regions 26 are made of Si, SiGe or Ge.

In some embodiments, an interfacial dielectric layer is formed between the channel region 26 and the gate dielectric layer 82. In some embodiments, the gate dielectric layer 82 includes a high-k dielectric layer, such as hafnium oxide. The gate structure includes the gate dielectric layer 82, the gate electrode layer 84 and sidewall spacers 45. In some embodiments, the sidewall spacer includes two or more (up to five) dielectric layers. Although FIGS. 1A, 1B, and 1C show four channel regions 26, the number of the channel regions 26 is not limited to four, and may be one, two, three one or more, and may be up to 10 or 15. By adjusting the number of the semiconductor wires or sheets, a driving current of the GAA FET device can be adjusted.

Further, a source/drain epitaxial layer 50 is disposed in or on the substrate 10. The source/drain epitaxial layer 50 is in direct contact with end faces of the channel regions 26, and is separated by insulating inner spacers 35 and the gate dielectric layer 82 from the gate electrode layer 84. In some embodiments, an air gap or a void 49 is formed below the source/drain epitaxial layer 50.

In some embodiments, an additional insulating layer (not shown) is conformally formed on a surface of the insulating inner spacers 35 between the insulating inner spacers 35 and the gate electrode layer 84. As shown FIG. 1A, the cross section, perpendicular to the Y direction, of the insulating inner spacer 35 has a rounded convex shape (e.g., semi-circular or U-shape) toward the gate electrode layer 84.

An interlayer dielectric (ILD) layer 70 is disposed over the source/drain epitaxial layer 50 and a conductive contact layer 72 is disposed on the source/drain epitaxial layer 50, and a conductive contact plug 75 passing though the ILD layer 70 is disposed over the conductive contact layer 72. The conductive contact layer 72 includes one or more layers of conductive material. In some embodiments, the conductive contact layer 72 includes a silicide layer, such as WSi, NiSi, TiSi or CoSi or other suitable silicide material or an alloy of a metal element and silicon and/or germanium. In some embodiments, an etch stop layer 68 is disposed between the sidewall spacers 45 and the ILD layer 70 and on a part of the upper surface of the source/drain epitaxial layer 50.

In some embodiments, the FET shown in FIGS. 1A, 1B, 1C, and 1D is a p-type FET. The source/drain epitaxial layer includes one or more layers of Si, SiGe, Ge, SiGeSn, SiSn and GeSnP. In some embodiments, the source/drain epitaxial layer further includes boron (B). In some embodiments, the FET shown in FIGS. 1A, 1B, 1C, and 1D is an n-type FET and the epitaxial layer includes one or more layers of Si, SiP, SiC, SiCP, SiAs, SiPAs and SiCAs.

FIGS. 2 to 14A and 14B show various stages of a sequential manufacturing operation of semiconductor FET devices. It is understood that additional operations can be provided before, during, and after processes shown by FIGS. 2 to 14B, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A, 1B, 1C, and 1D may be employed in the embodiment of FIGS. 2 to 14B, and detailed explanation thereof may be omitted.

Figure 2:
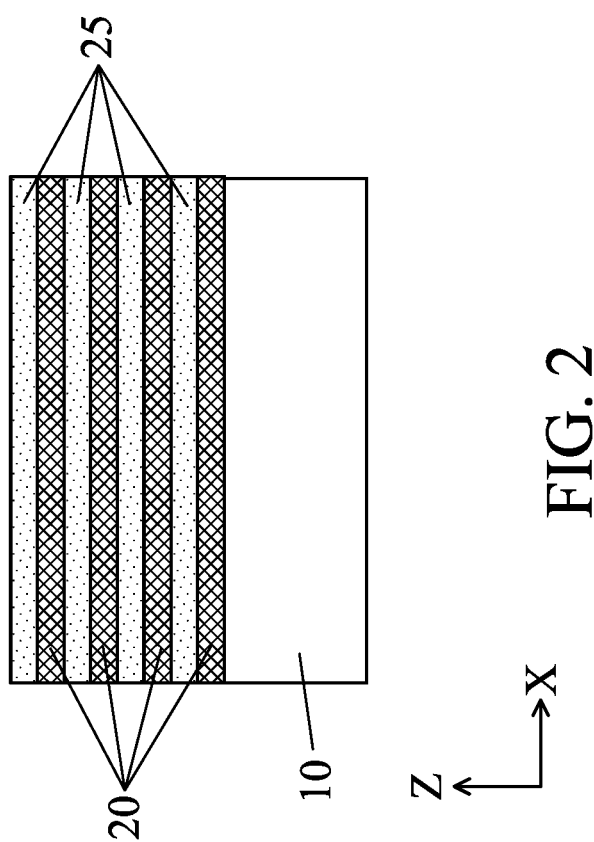
FIG. 2 shows one of the various stages of a sequential manufacturing process of a semiconductor GAA FET device according to an embodiment of the present disclosure.

As shown in FIG. 2, first semiconductor layers 20 and second semiconductor layers 25 are alternately formed over the substrate 10. The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP. The second semiconductor layers 25 are consistent with the channel regions 26 of FIGS. 1A, 1B, and 1C.

In some embodiments, the first semiconductor layers 20 and the second semiconductor layers 25 are made of Si, a Si compound, SiGe, Ge or a Ge compound. In some embodiments, the first semiconductor layers 20 are $Si_{1-x}Ge_x$, where x is equal to or more than about 0.1 and equal to or less than about 0.6, and the second semiconductor layers 25 are Si or $Si_{1-y}Ge_y$, where y is smaller than x and equal to or less than about 0.2. In this disclosure, an "M" compound" or an "M based compound" means the majority of the compound is M.

In other embodiments, the second semiconductor layers 25 are $Si_{1-x}Ge_x$, where x is equal to or more than about 0.1 and equal to or less than about 0.6, and the first semiconductor layers 20 are Si or $Si_{1-y}Ge_y$, where y is smaller than x and equal to or less than about 0.2.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 5 nm to about 60 nm in some embodiments, and is in a range from about 10 nm to about 30 nm in other embodiments. The thickness of the second semiconductor layers 25 is in a range from about 5 nm to about 60 nm in some embodiments, and is in a range from about 10 nm to about 30 nm in other embodiments. The thickness of the first semiconductor layers 20 may be the same as, or different from the thickness of the second semiconductor layers 25. Although four first semiconductor layers 20 and four second semiconductor layers 25 are shown in FIG. 2, the numbers are not limited to four, and can be 1, 2, 3 or more than 4, and is less than 20. In some embodiments, the number of the first semiconductor layers 20 is greater, by one, from the number of the second semiconductor layers 25 (i.e.—the top layer is the first semiconductor layer 20).

Figure 3:
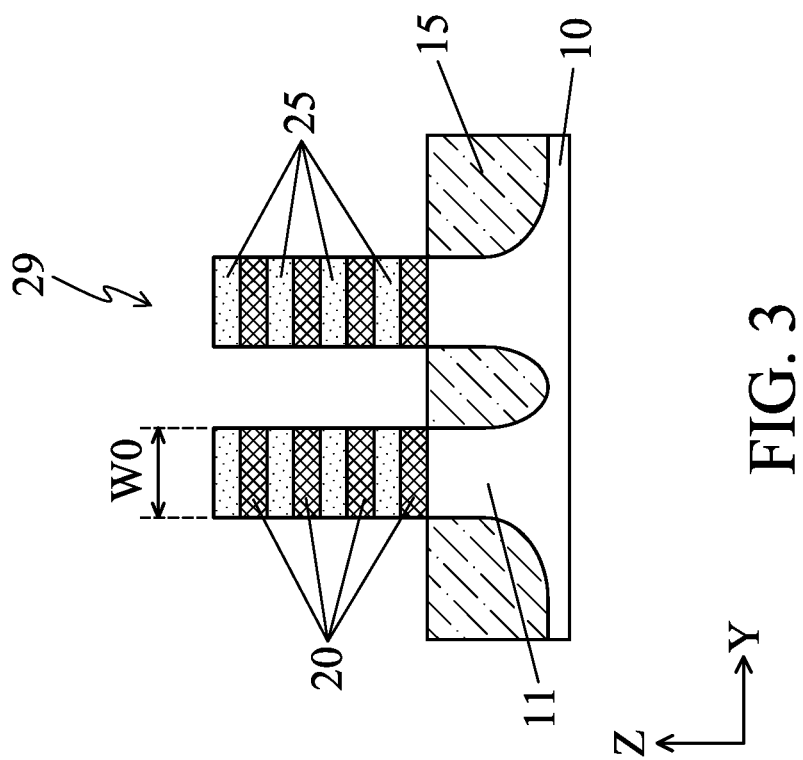
FIG. 3 shows one of the various stages of a sequential manufacturing process of a semiconductor GAA FET device according to an embodiment of the present disclosure.

After the stacked semiconductor layers are formed, fin structures 29 are formed by using one or more lithography and etching operations, as shown in FIG. 3. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

As shown in FIG. 3, the fin structures 29 extend in the X direction and are arranged in the Y direction. The number of the fin structures is not limited to two as shown in FIG. 3, and may be as small as one and three or more. In some embodiments, one or more dummy fin structures are formed on both sides of the fin structures 29 to improve pattern fidelity in the patterning operations. As shown in FIG. 3, the fin structures 29 have upper portions constituted by the stacked first and second semiconductor layers 20, 25 over the base portion 11 of the fin structures 29.

The width W0 of the upper portion of the fin structure 29 along the Y direction is in a range from about 8 nm to about 100 nm in some embodiments, and is in a range from about 15 nm to about 30 nm in other embodiments.

After the fin structures 29 are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-enhanced CVD (PECVD) or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, one or more fin liner layers are formed over the fin structures before forming the insulating material layer. In some embodiments, the fin liner layers include a first fin liner layer formed over the substrate 10 and sidewalls of the base portion 11 of the fin structures 29, and a second fin liner layer formed on the first fin liner layer. The fin liner layers are made of silicon nitride or a silicon nitride-based material (e.g., SiON, SiCN or SiOCN). The fin liner layers may be deposited through one or more processes such as physical vapor deposition (PVD), chemical vapor deposition (CVD), or atomic layer deposition (ALD), although any acceptable process may be utilized.

Then, as shown in FIG. 3, the insulating material layer is recessed to form an isolation insulating layer 15 so that the upper portions of the fin structures 29 are exposed. With this operation, the fin structures 29 are separated from each other by the isolation insulating layer 15, which is also called a shallow trench isolation (STI). The isolation insulating layer 15 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 15 is formed through a process such as CVD, flowable CVD (FCVD), or a spin-on-glass process, although any acceptable process may be utilized.

In some embodiments, the isolation insulating layer 15 is recessed until the upper portion of the fin structure 29 over the base portion 11 is exposed. In other embodiments, the upper portion of the fin structure 29 is not exposed. The first semiconductor layers 20 are sacrificial layers which are subsequently partially removed, and the second semiconductor layers 25 are subsequently formed into semiconductor wires as channel regions 26 of the GAA FET. In other embodiments, the second semiconductor layers 25 are sacrificial layers which are subsequently partially removed, and the first semiconductor layers 20 are subsequently formed into semiconductor wires as channel regions 26.

Figure 4B:
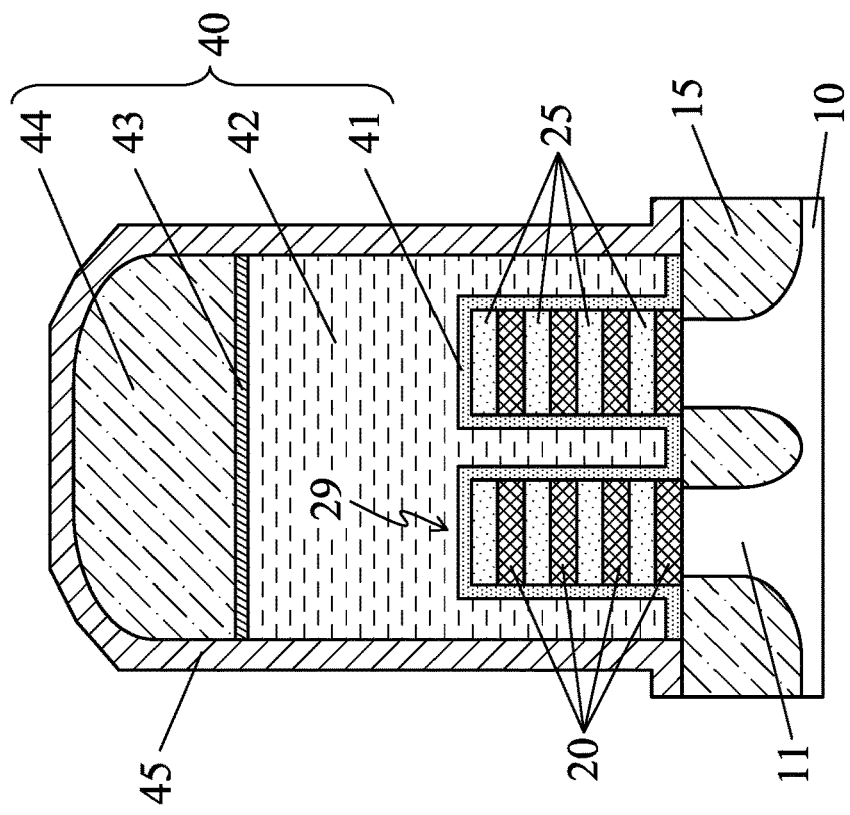
FIGS. 4A and 4B show one of the various stages of a sequential manufacturing process of a semiconductor GAA FET device according to an embodiment of the present disclosure.
Figure 4A:
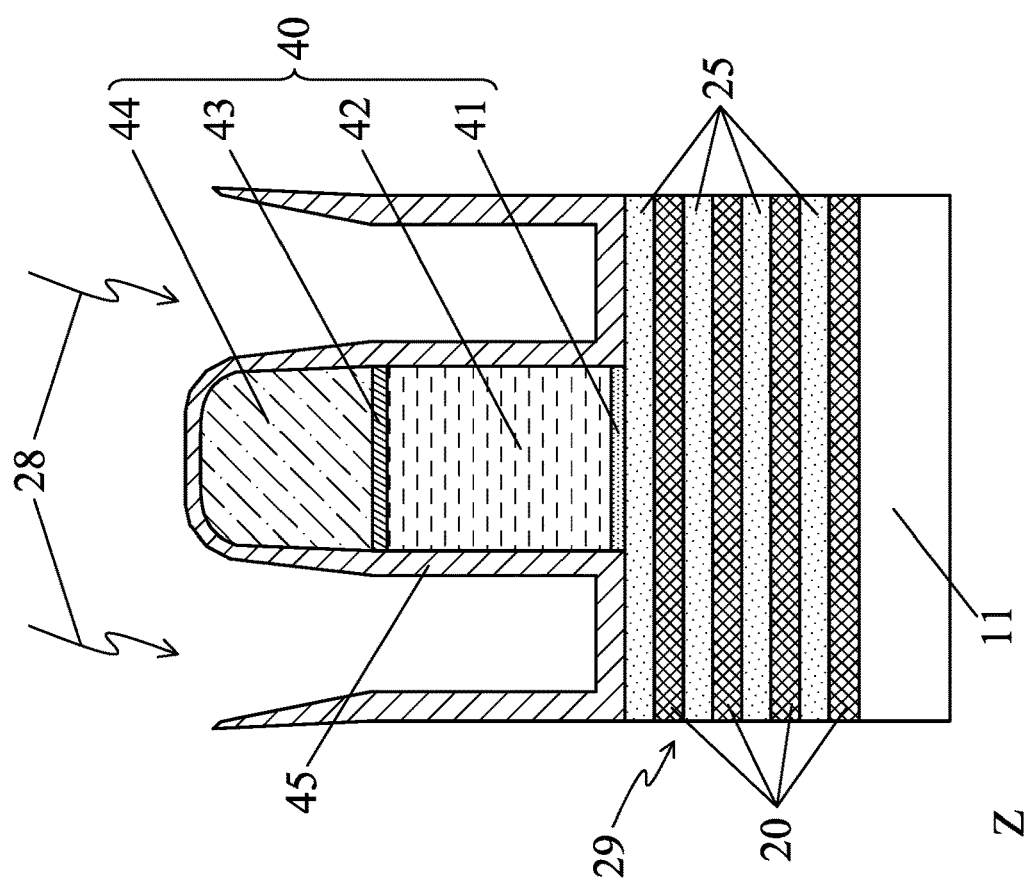

After the isolation insulating layer 15 is formed, a sacrificial (dummy) gate structure 40 is formed, as shown in FIGS. 4A and 4B. FIGS. 4A and 4B illustrate a structure after a sacrificial gate structure 40 is formed over the exposed fin structures 29. The sacrificial gate structure 40 is formed over a portion of the fin structures which is to be a channel region. The sacrificial gate structure 40 defines the channel region (channel length) of the GAA FET. The sacrificial gate structure 40 includes a sacrificial gate dielectric layer 41 and a sacrificial gate electrode layer 42. The sacrificial gate dielectric layer 41 includes one or more layers of insulating material, such as a silicon oxide-based material. In one embodiment, silicon oxide formed by CVD is used. The thickness of the sacrificial gate dielectric layer 41 is in a range from about 1 nm to about 5 nm in some embodiments.

The sacrificial gate structure 40 is formed by first blanket depositing the sacrificial gate dielectric layer 41 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad silicon nitride layer 43 and a silicon oxide mask layer 44.

Next, a patterning operation is performed and the mask layer and the sacrificial gate electrode layer are patterned into the sacrificial gate structure 40, as shown in FIGS. 4A and 4B. The sacrificial gate structure includes the sacrificial gate dielectric layer 41, the sacrificial gate electrode layer 42 (e.g., poly silicon), the pad silicon nitride layer 43 and the silicon oxide mask layer 44. By patterning the sacrificial gate structure, the stacked layers of the first and second semiconductor layers 20 and 25 are partially exposed on opposite sides of the sacrificial gate structure, thereby defining source/drain region (28), as shown in FIG. 4A. In this disclosure, a source and a drain are interchangeably used and the structures thereof are substantially the same. In FIGS. 4A and 4B, one sacrificial gate structure is formed over two fin structures, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Further, a first cover layer for the gate sidewall spacers 45 is formed over the sacrificial gate structure 40, as shown in FIGS. 4A and 4B. The cover layer 45 is deposited in a conformal manner so that it has substantially equal thicknesses on vertical surfaces, such as the sidewalls, horizontal surfaces, and the top of the sacrificial gate structure, respectively. In some embodiments, the first cover layer 45 has a thickness in a range from about 5 nm to about 20 nm. The first cover layer includes one or more of silicon nitride, SiON, SiCN, SiCO, SiOCN or any other suitable dielectric material. The cover layer (sidewall spacers 45) can be formed by ALD or CVD, or any other suitable method.

Next, as shown in FIGS. 5A and 5B, the first cover layer is anisotropicaly etched to remove the horizontal portion of the first cover layer disposed on the source/drain region 28 (see, FIGS. 6A and 6B) and the top of the gate structure, while leaving the first cover layer as sidewall spacers 45 on side faces of the sacrificial gate structure 40 and the fin structures 29.

Figure 6A:
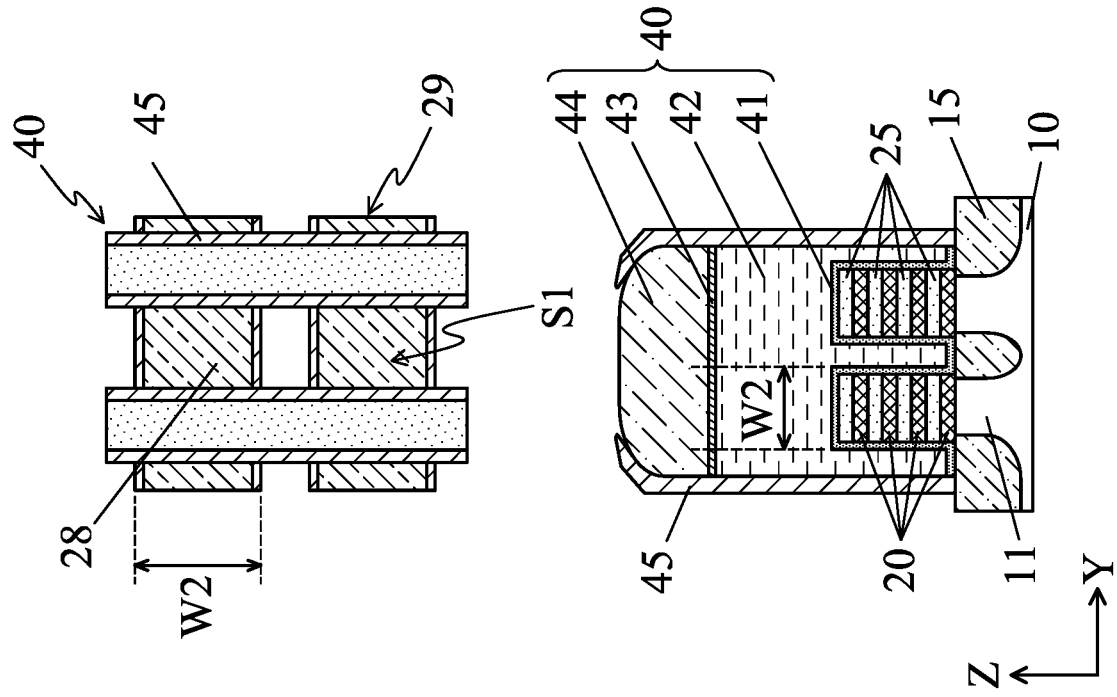
FIGS. 6A and 6B show plan views (top views) and cross sectional views of gate structures and nano sheets or nano wires for a semiconductor GAA FET device according to an embodiment of the present disclosure.
Figure 6B:
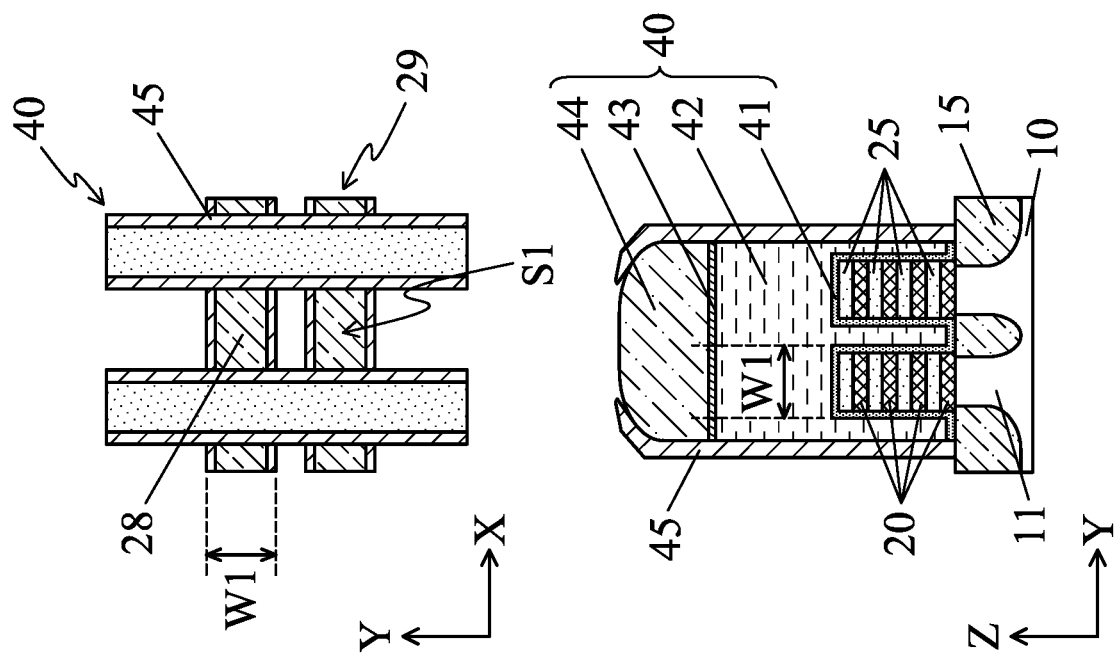

FIGS. 6A and 6B shows plan view and cross sectional views of the gate structures and fin structures 29. In some embodiments, the semiconductor device includes two or more GAA FETs having different channel widths (fin widths). In some embodiments, the first GAA FET has a channel width W1 (fin width) as shown in FIG. 6A and the second GAA FET has a channel width (fin width) W2 as shown in FIG. 6B, where W1 is smaller than W2. In some embodiments, W1 is in a range from about 5 nm to about 25 nm, and W2 is in a range from about 10 nm to about 30 nm. In some embodiments, W1 is in a range from about 8 nm to about 18 nm, and W2 is in a range from about 14 nm to about 24 nm. In some embodiments, W1 is about 75% to about 85% of W2. In some embodiments, the three or more types of GAA FETs having different channel widths are provided. In some embodiments, the n-th GAA FET has a channel width $W_n$ which is about 1.15 to 1.33 of the channel width $W_{n-1}$ of the (n−1)th GAA FET.

In some embodiments, the source/drain region 28 of the first GAA FET shown in FIG. 6A has an area S1 in plan view, and the source/drain region 28 of the second GAA FET shown in FIG. 6B has an area S2 in plan view, where S1<S2. In some embodiments, S1<S2 and W1=W2. The area S1 is about 75% to about 85% of S2 in some embodiments. In some embodiments, S1<S2 where the space between adjacent sacrificial gate structures is the same between the first and second GAA FETs, and in other embodiments, S1<S2 where the spaces between adjacent sacrificial gate structures are different between the first and second GAA FETs.

In the following description, FIGS. 7A, 8A, ... and 14A correspond to the first GAA FET (narrow width (W1)) and FIGS. 7B, 8B, ... and 14B correspond to the second GAA FET (wide width (W2)).

Figure 7A:
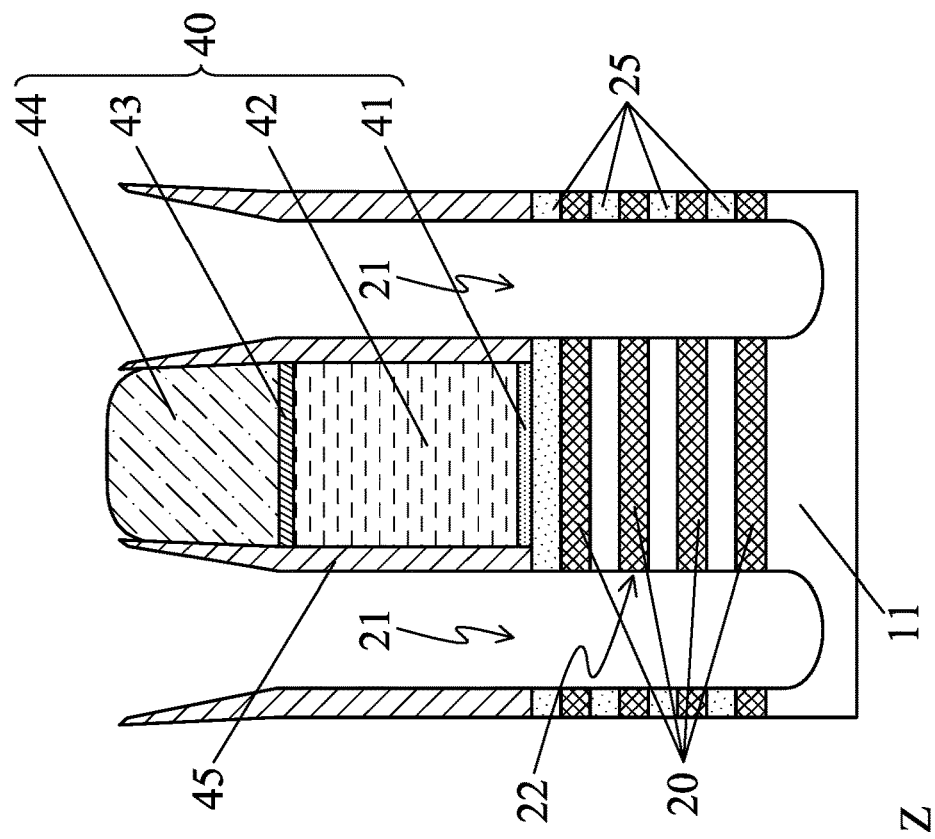
FIGS. 7A and 7B show one of the various stages of a sequential manufacturing process of a semiconductor GAA FET device according to an embodiment of the present disclosure.
Figure 7B:
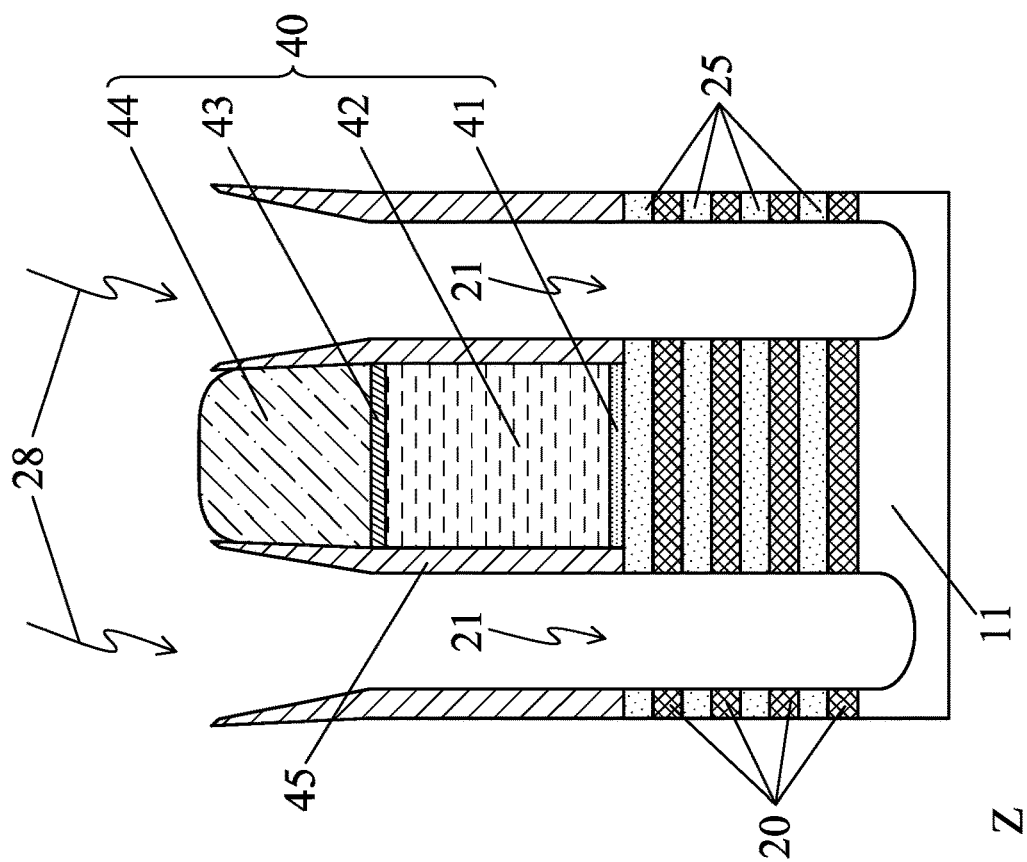

Then, as shown in FIGS. 7A and 7B, the stacked structure of the first semiconductor layers 20 and the second semiconductor layer 25 is etched down at the source/drain region 28 (e.g., between two gate structures), by using one or more lithography and etching operations, thereby forming a recessed source/drain space 21. In some embodiments, the substrate 10 (or the base portion 11 of the fin structure) is also partially etched. In some embodiments, an n-type FET and a p-type FET are manufactured separately, and in such a case, a region for one type of FET is processed, and a region for the other type of FET is covered by a protective layer, such as a silicon nitride. In some embodiments, as shown in FIGS. 7A and 7B, the recessed space 21 has a U-shape. In other embodiments, the recessed space 21 has a V-shape showing (111) facets of silicon crystal. In other embodiments, the recessed spaced 21 has a reverse trapezoid shape, or a rectangular shape.

In some embodiments, the recessed source/drain space 21 is formed by a dry etching process, which may be anisotropic. The anisotropic etching process may be performed using a process gas mixture including $BF_2$, $Cl_2$, $CH_3F$, $CH_4$, HBr, $O_2$, Ar, or other etchant gases. The plasma is a remote plasma that is generated in a separate plasma generation chamber connected to the processing chamber. Process gases may be activated into plasma by any suitable method of generating the plasma, such as transformer coupled plasma (TCP) systems, inductively coupled plasma (ICP) systems, magnetically enhanced reactive ion techniques. The process gases used in the plasma etching process include etchant gases such as $H_2$, Ar, other gases, or a combination of gases. In some embodiments, carrier gases, such as $N_2$, Ar, He, or Xe are used in a plasma etching process using hydrogen (H) radicals. The H radicals may be formed by flowing $H_2$ gas into a plasma generation chamber and igniting a plasma within the plasma generation chamber. In some embodiments, an additional gas may be ignited into a plasma within the plasma generation chamber, such as Ar. The H radicals may selectively etch (100) planes over (111) planes or (110) planes. In some cases, the etch rate of (100) planes may be about three times greater than the etch rate of (111) planes. Due to this selectivity, the etching by the H radicals may tend to slow or stop along (111) planes or (110) planes of silicon during the etching process.

Further, as shown in FIGS. 8A and 8B, the first semiconductor layers 20 are laterally etched in the X direction within the source/drain space 21, thereby forming cavities or lateral recesses 22. When the first semiconductor layers 20 are SiGe and the second semiconductor layers 25 are Si, the first semiconductor layers 20 can be selectively etched by using a wet etchant such as, but not limited to, a mixed solution of $H_2O_2$, $CH_3COOH$ and HF, followed by $H_2O$ cleaning. In some embodiments, the etching by the mixed solution and cleaning by water is repeated 10 to 20 times. The etching time by the mixed solution is in a range from about 1 min to about 2 min in some embodiments. The mixed solution is used at a temperature in a range from about 60° C. to about 90° C. in some embodiments. In some embodiments, other etchants are used.

Figure 9A:
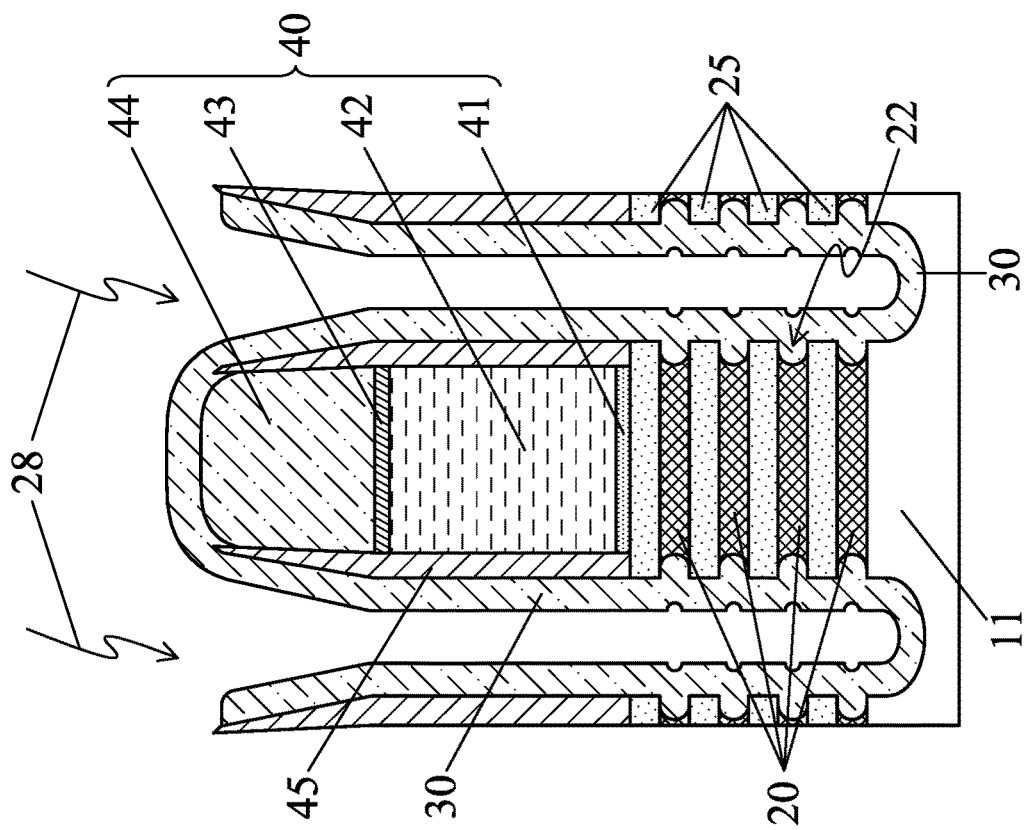
FIGS. 9A and 9B show one of the various stages of a sequential manufacturing process of a semiconductor GAA FET device according to an embodiment of the present disclosure.
Figure 9B:
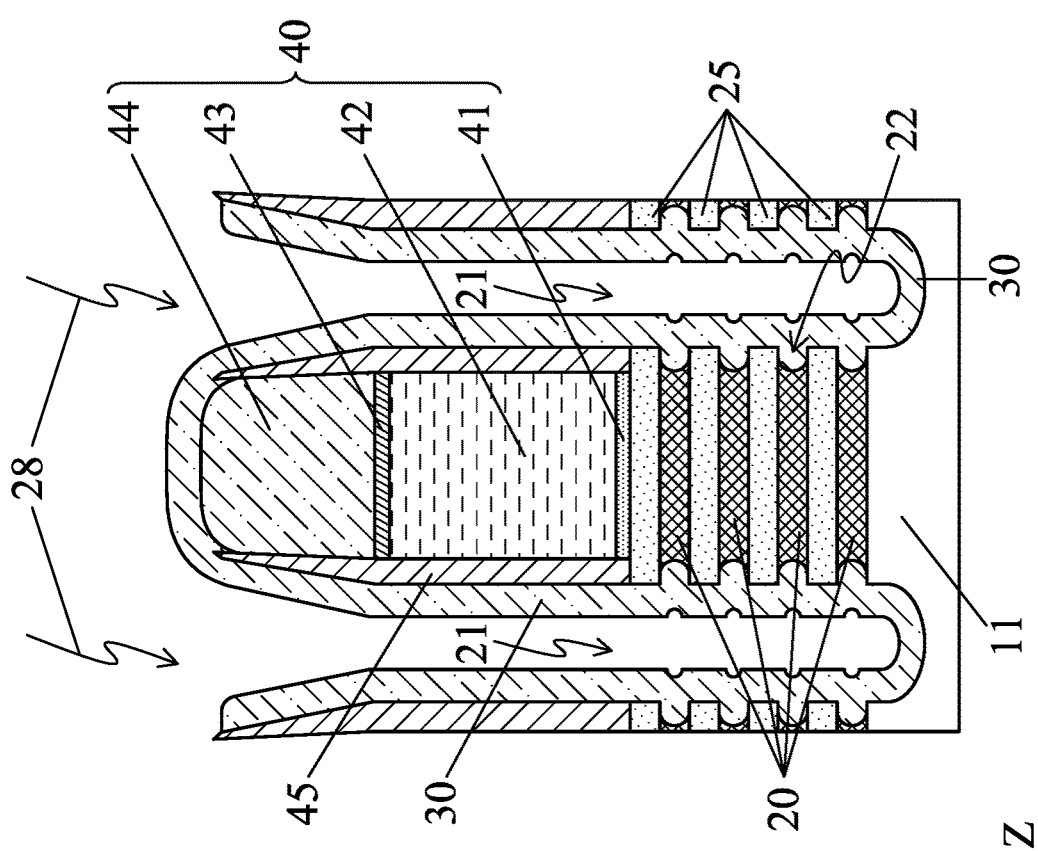

Next, as shown in FIGS. 9A and 9B, a first insulating layer 30 is conformally formed in the source/drain space 21. The first insulating layer 30 is formed on the etched lateral ends of the first semiconductor layers 20, e.g., the cavities 22, and on end faces of the second semiconductor layers 25 in the source/drain space 21 and is formed over the sacrificial gate structure 40. The first insulating layer 30 includes one of silicon nitride and silicon oxide, SiON, SiOC, SiCN and SiOCN, or any other suitable dielectric material. The first insulating layer 30 is made of a different material than the sidewall spacers 45 (first cover layer). The first insulating layer 30 has a thickness in a range from about 1.0 nm to about 10.0 nm in some embodiments. In other embodiments, the first insulating layer 30 has a thickness in a range from about 2.0 nm to about 5.0 nm. The first insulating layer 30 can be formed by ALD or any other suitable methods. By conformally forming the first insulating layer 30, the cavities 22 of the first semiconductor layers 20 in the source/drain space 21 are fully filled with the first insulating layer 30. As shown, a bottom of the source/drain space 21 and the walls surrounding the source/drain space 21 is covered with the first insulating layer 30. In some embodiments, a second insulating layer (not shown) is disposed over or below the first insulating layer 30.

Figure 10A:
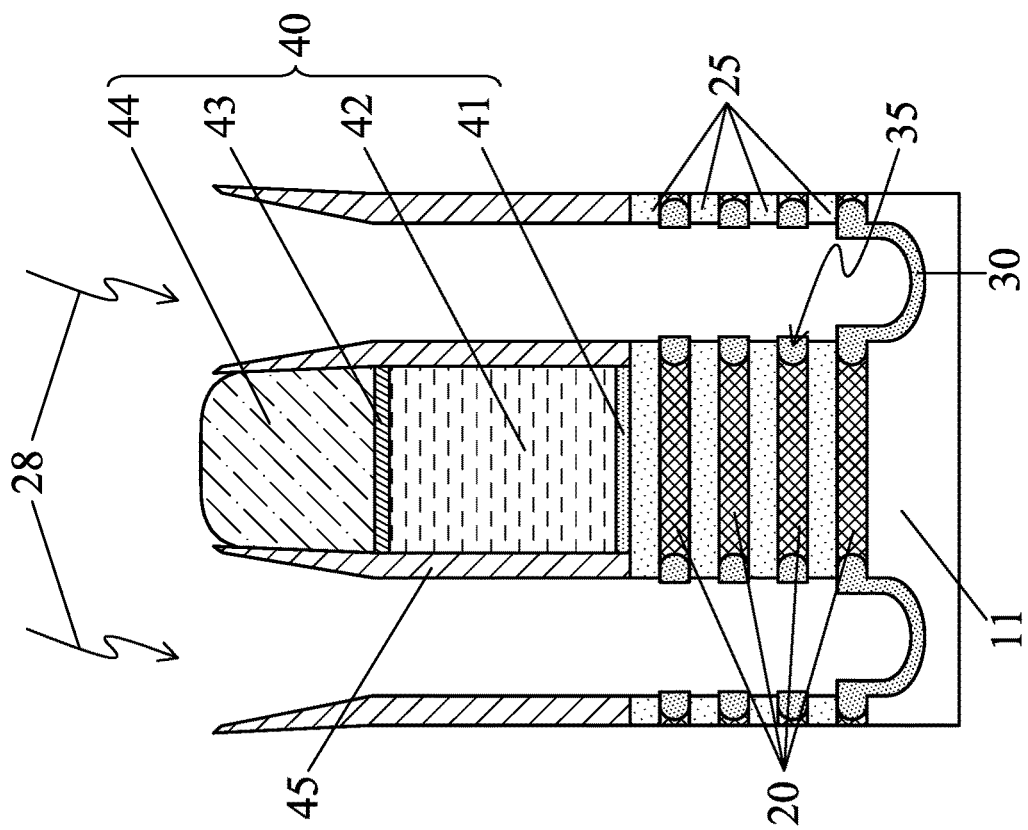
FIGS. 10A and 10B show one of the various stages of a sequential manufacturing process of a semiconductor GAA FET device according to an embodiment of the present disclosure.
Figure 10B:
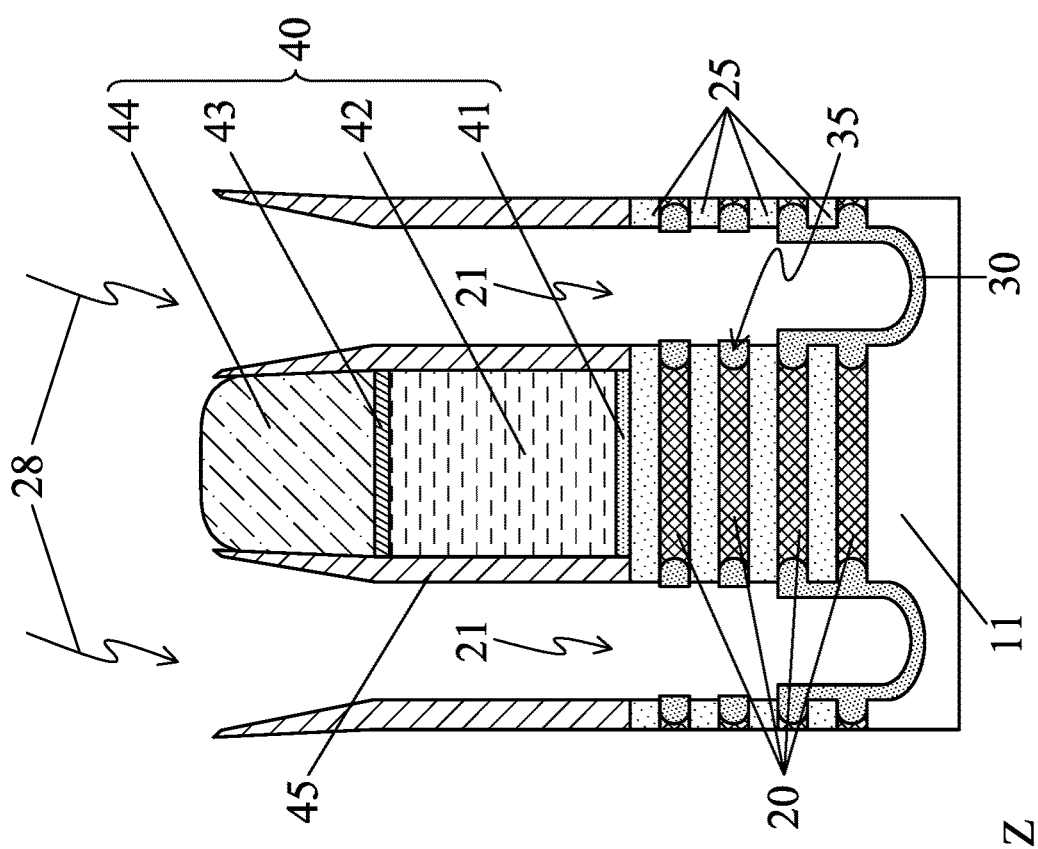

Further, as shown in FIGS. 10A and 10B, isotropic etching and/or anisotropic etching are performed to remove part of the first insulating layer 30, thereby forming inner spacers 35 on the end faces of the first semiconductor layers 20. In some embodiments, the first insulating layer 30 formed over the sacrificial gate structure 40 is fully removed.

In some embodiments, in the narrow width channel of the first GAA FET shown in FIG. 10A, since the aspect ratio of the source/drain space 21 is small because of the small fin width, the etching operation leaves a part of the first insulating layer 30 in the source/drain space 21. In some embodiments, as shown in FIG. 10A, the remaining first insulting layer 30 fully covers the end face of the bottommost one of the second semiconductor layers 25. In other embodiments, the remaining first insulating layer 30 fully covers the end faces of two or more second semiconductor layers 25 from the bottom.

Similarly, in the wide width channel of the second GAA FET shown in FIG. 10B, the etching operation leaves a part of the first insulating layer 30 in the source/drain space 21. In some embodiments, however, since the channel width (fin width) is grater in the second GAA FET than the first GAA FET, the remaining first insulting layer 30 does not cover the end face of the bottommost one of the second semiconductor layers 25. In some embodiments, the bottom of the source/drain space 21 is covered by the remaining first insulating layer 30, which is continuous to the inner spacers 35 formed on the end faces of the bottommost one of the first semiconductor layers 20.

In some embodiments, when the remaining first insulating layer 30 covers the end faces of two or more second semiconductor layers in the first GAA FET, the remaining first insulating layer 30 covers the end faces of one or more second semiconductor layers in the second GAA FET, and the difference in the number of second semiconductor layers of which ends are fully covered by the remaining first insulating layer 30 is one, two or more.

Figure 11A:
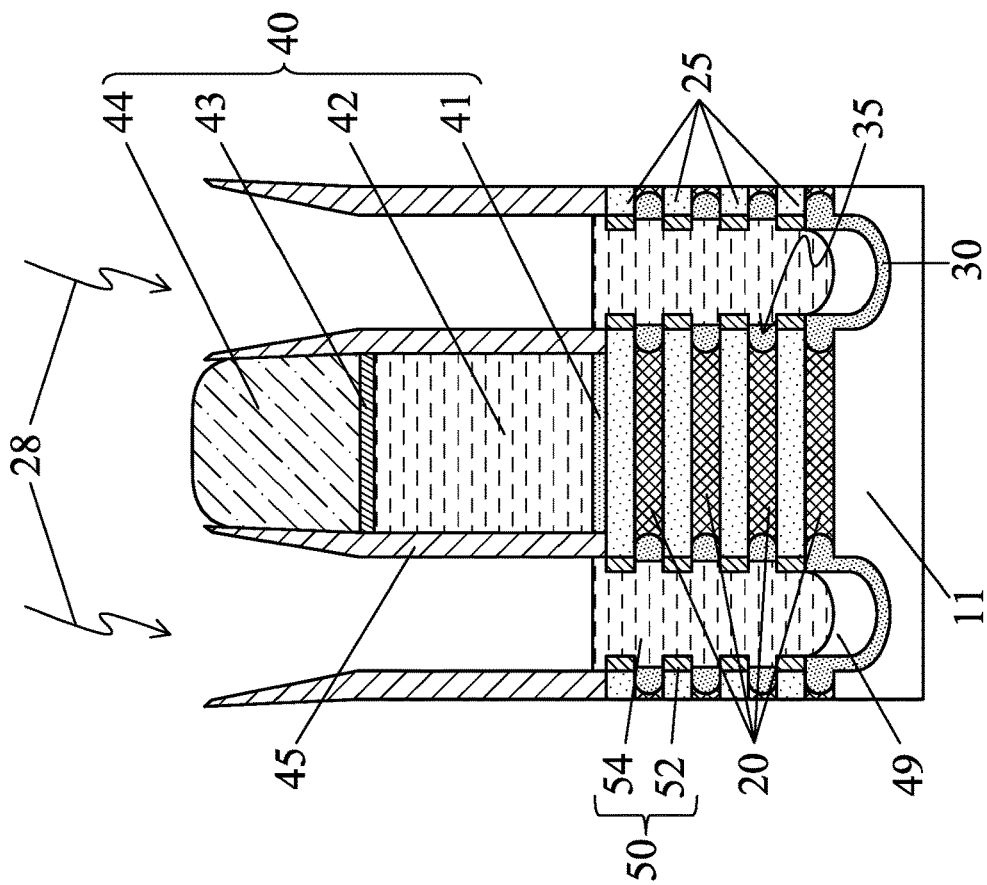
FIGS. 11A and 11B show one of the various stages of a sequential manufacturing process of a semiconductor GAA FET device according to an embodiment of the present disclosure.
Figure 11B:
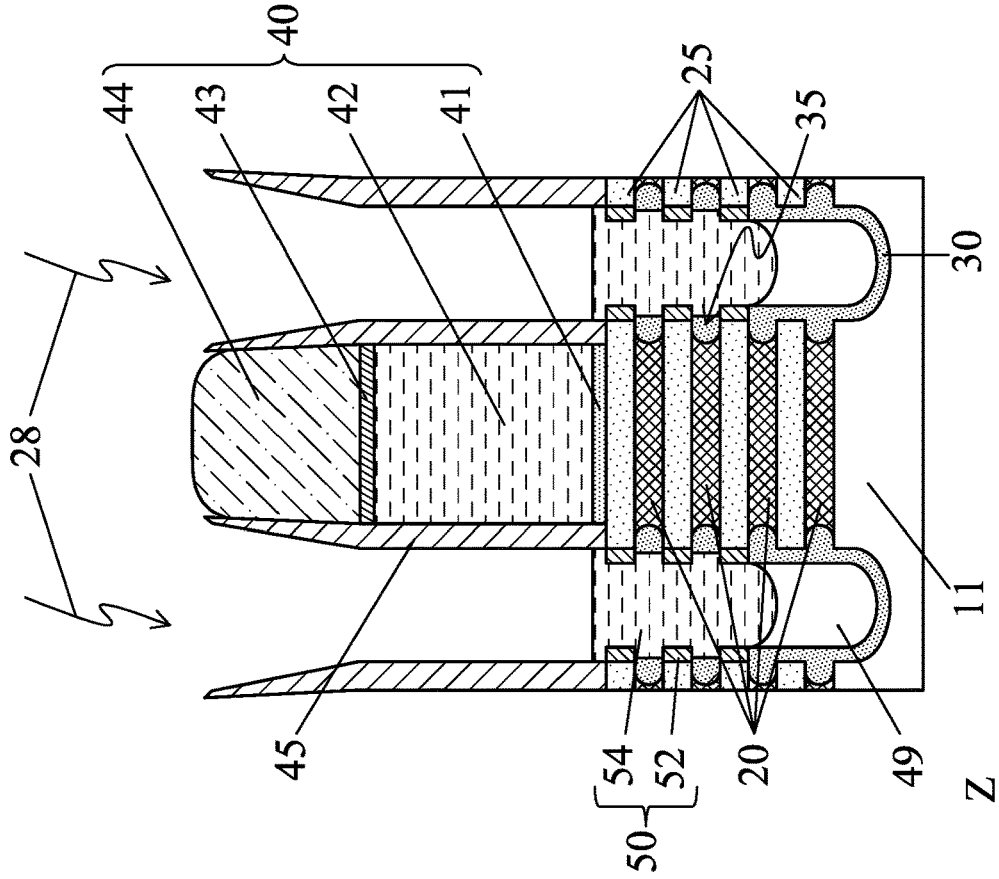

After the inner spacers 35 are formed as shown in FIGS. 10A and 10B, one or more source/drain epitaxial layers are formed in the source/drain space 21, as shown in FIGS. 11A and 11B. In some embodiments, the source/drain epitaxial layer 50 includes a first epitaxial layer 52 formed on the end faces of the second semiconductor layer 25 and a second epitaxial layer 54 formed on the first epitaxial layer 52 and over the inner spacers 35. As shown in FIGS. 11A and 11B, since the epitaxial layer does not start growing from the remaining insulating layer 30, an air gap 49 is formed below the source/drain epitaxial layer.

In some embodiments, the first epitaxial layer 52 is one or more of SiAs, SiCAs or SiPAs, and the second epitaxial layer 54 is one or more of SiP, SiCP or SiC, for an n-type GAA FET. In some embodiments, the first epitaxial layer 52 is one or more of SiB or SiGeB, and the second epitaxial layer 54 is one or more of SiGe or SiGeSn, which may contain B, for a p-type GAA FET.

As shown in FIG. 11A, in the first GAA FET having a narrow channel width, three second semiconductor layers 25 are connected to the source/drain epitaxial layers, and thus function as channels of a FET. On the other hand, as shown in FIG. 11B, in the second GAA FET having a wide channel width, four second semiconductor layers 25 are connected to the source/drain epitaxial layers, and thus function as channels of a FET. As such, the second GAA FET has a greater on-current than the first GAA FET not only due to the difference in channel width but also due to the difference in number of nano sheets or wires.

After the source/drain epitaxial layer 50 is formed, an interlayer dielectric (ILD) layer 70 is formed over the source/drain epitaxial layer 50, the sacrificial gate structure 40, and the sidewall spacers 45. The materials for the ILD layer 70 include compounds comprising Si, O, C and/or H, such as silicon oxide, SiCOH and SiOC. Organic materials, such as polymers, may be used for the ILD layer 70. In some embodiments, an etch stop layer 68 is formed before the ILD layer 70 is formed. In some embodiments, the etch stop layer 68 includes silicon nitride or SiON.

Figure 12A:
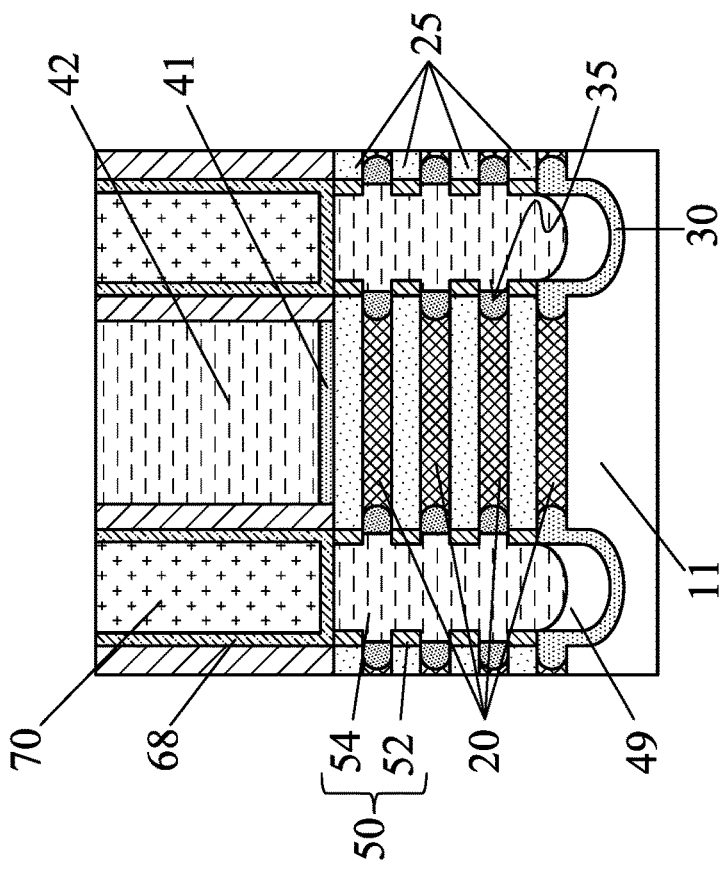
FIGS. 12A and 12B show one of the various stages of a sequential manufacturing process of a semiconductor GAA FET device according to an embodiment of the present disclosure.
Figure 12B:
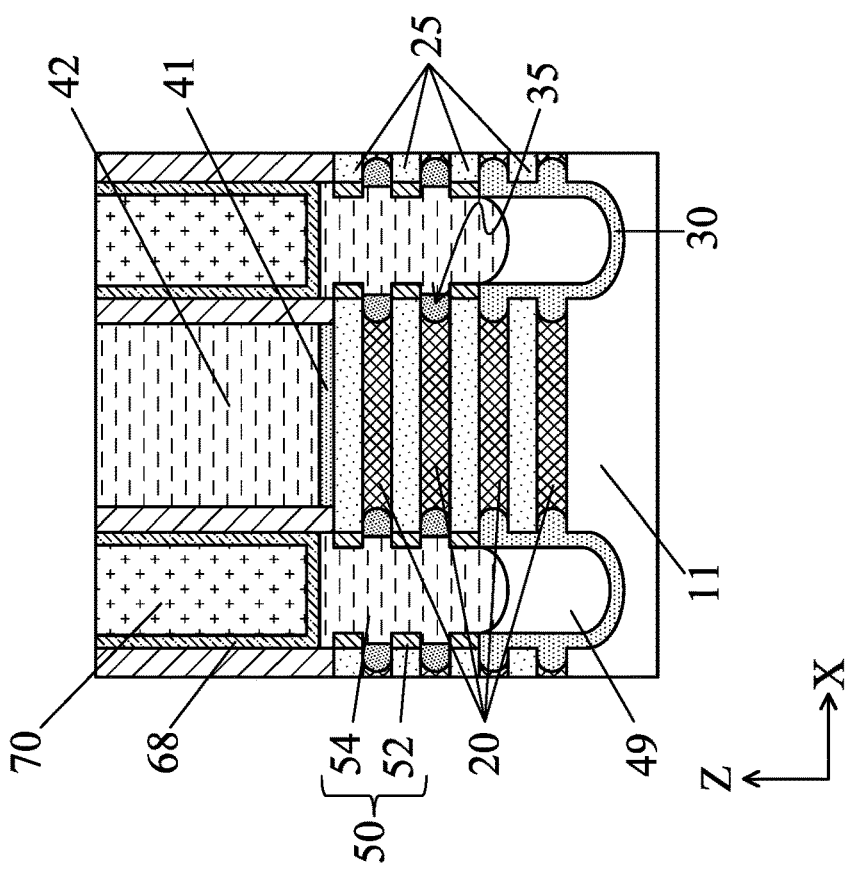

After the ILD layer 70 is formed, one or more planarization operations, such as CMP, are performed, so that the top portion of the sacrificial gate electrode layer 42 is exposed, as shown in FIGS. 12A and 12B.

Then, the sacrificial gate electrode layer 42 and sacrificial gate dielectric layer 41 are removed. The ILD layer 70 protects the source/drain epitaxial layer 50 during the removal of the sacrificial gate structures 40. The sacrificial gate structures 40 can be removed using plasma dry etching and/or wet etching. When the sacrificial gate electrode layer 42 is polysilicon and the ILD layer 70 is silicon oxide, a wet etchant such as a TMAH solution can be used to selectively remove the sacrificial gate electrode layer 42. The sacrificial gate dielectric layer 41 is thereafter removed using plasma dry etching and/or wet etching.

Figure 13A:
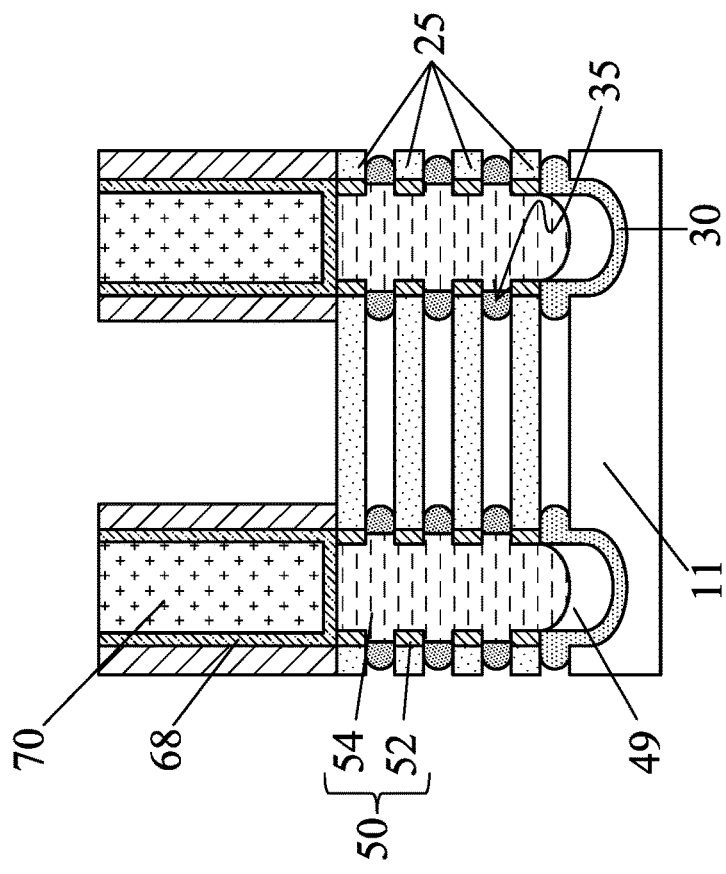
FIGS. 13A and 13B show one of the various stages of a sequential manufacturing process of a semiconductor GAA FET device according to an embodiment of the present disclosure.
Figure 13B:
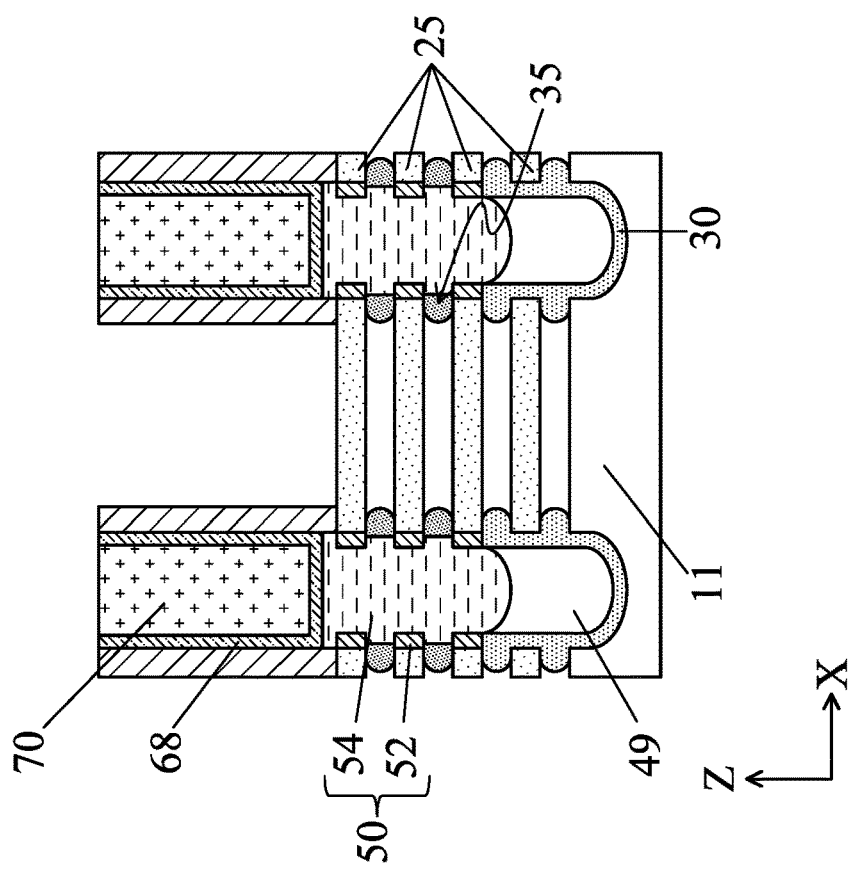

After the sacrificial gate structures are removed, the first semiconductor layers 20 are removed, thereby forming wires or sheets (channel regions) of the second semiconductor layers 25, as shown in FIGS. 13A and 13B. The first semiconductor layers 20 can be removed/etched using an etchant that can selectively etch the first semiconductor layers 20 against the second semiconductor layers 25 and against the inner spacers 35 that act as etch stops.

Figure 14A:
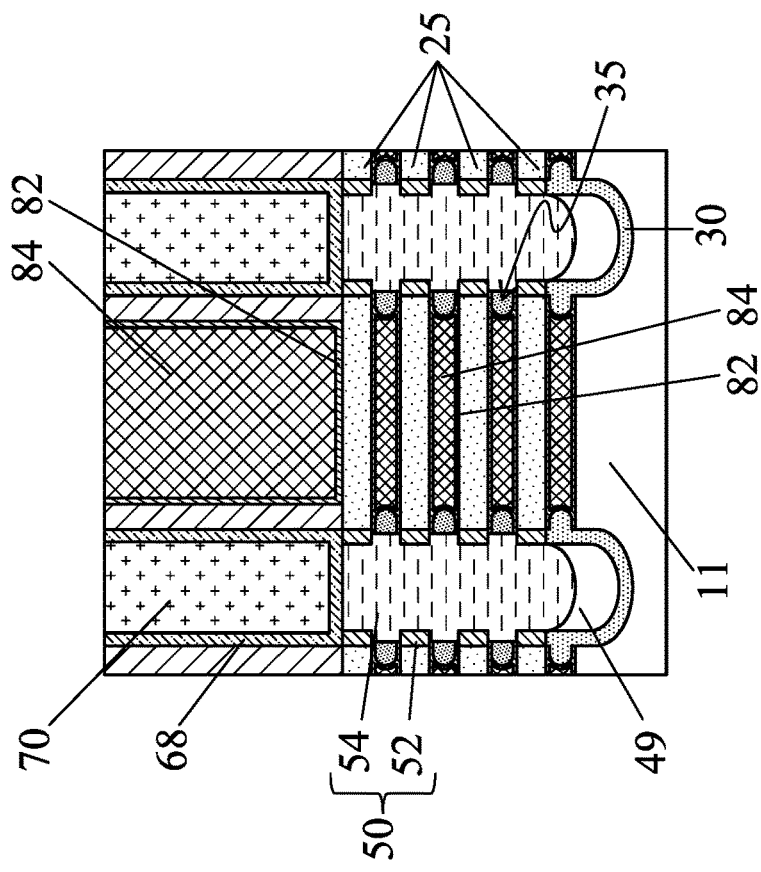
FIGS. 14A and 14B show one of the various stages of a sequential manufacturing process of a semiconductor GAA FET device according to an embodiment of the present disclosure.
Figure 14B:
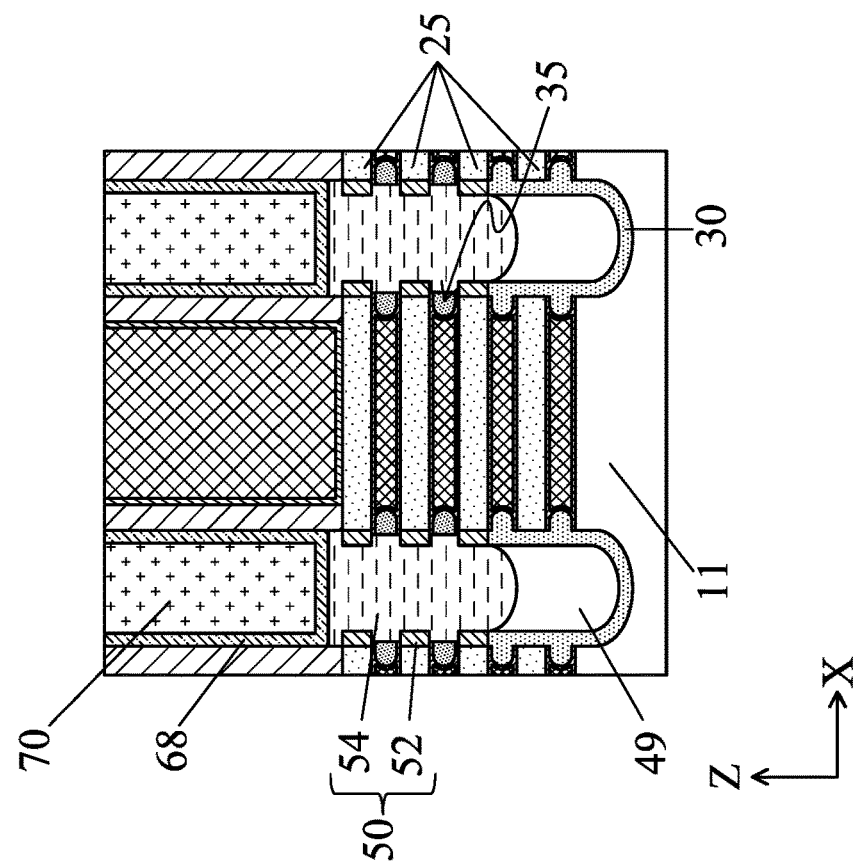

Further, a metal gate structure that includes the gate dielectric layer 82 and the gate electrode layer 84 are formed to wrap around each of the semiconductor sheets or wires 25, as shown in FIGS. 14A and 14B.

After the metal gate structure is formed, the ILD layer 70 is patterned and a conductive contact layer 72 is formed over the epitaxial layer 50 and a conductive contact plug 75 is formed on the conductive contact layer 72 similar to FIG. 1. In some embodiments, the conductive contact layer 72 includes one or more of Co, Ni, W, Ti, Ta, Cu, Al, silicide thereof, TiN and TaN. The conductive contact plug 75 includes one or more layers of Co, Ni, W, Ti, Ta, Cu, Al, TiN and TaN.

FIGS. 15A and 15B to 19A and 19B show details of the sequential manufacturing operation explained with respect to FIGS. 8A and 8B to 11A and 11B above. It is understood that additional operations can be provided before, during, and after processes shown by FIGS. 15A to 19B, and some of the operations described below can be replaced or eliminated, for additional embodiments of the method. The order of the operations/processes may be interchangeable. Materials, configurations, dimensions and/or processes the same as or similar to the foregoing embodiments described with respect to FIGS. 1A, 1B, 1C, and 1D and 1-14B may be employed in the embodiment of FIGS. 15A to 19B, and detailed explanation thereof may be omitted. In the following description, FIGS. 15A, 16A, . . . and 19A correspond to the first GAA FET (narrow width) and FIGS. 15B, 16B, . . . and 19B correspond to the second GAA FET (wide width), as shown in FIGS. 6A and 6B.

Similar to FIGS. 8A and 8B, the first semiconductor layers 20 are laterally etched in the X direction within the source/drain space 21, thereby forming cavities or lateral recesses 22, as shown in FIGS. 15A and 15B. In some embodiments, the gate sidewall spacer includes a first layer 45-1 made of low-k dielectric material (e.g., SiOC, SiCN and/or SiOCN) and a second layer 45-2 made of different material than the first layer, e.g., silicon oxide, silicon nitride, SiON, and etc.

Next, similar to FIGS. 9A and 9B, a first insulating layer 30 is conformally formed in the source/drain space 21, as shown in FIGS. 16A and 16B.

Figure 18A:
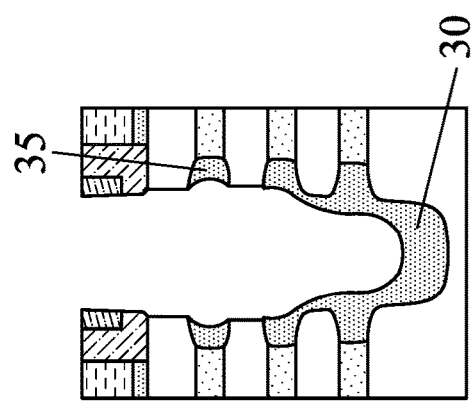
FIGS. 18A and 18B show one of the various stages of a sequential manufacturing process of a semiconductor GAA FET device according to an embodiment of the present disclosure.
Figure 18B:
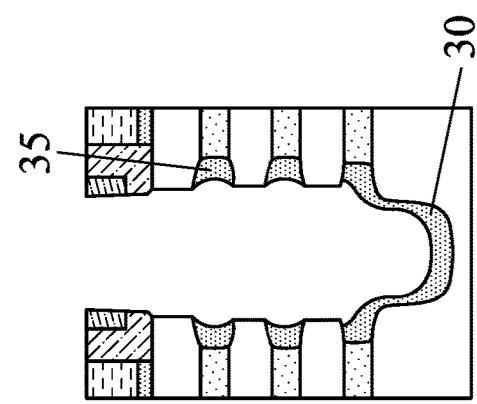

Further, similar to FIGS. 10A and 10B, isotropic etching and/or anisotropic etching are performed to remove part of the first insulating layer 30, thereby forming inner spacers 35 on the end faces of the first semiconductor layers 20, as shown in FIGS. 17A and 17B and FIGS. 18A and 18B. In some embodiments, as shown in FIGS. 17A and 17B, an etching byproduct 33 (e.g., polymer) is deposited at the bottom of the space 21. Since the wide width channel GAA FET shown in FIG. 17B has a larger channel width, i.e., a greater opening of the source/drain space 21 (S1<S2 shown in FIGS. 6A and 6B), than the narrow width channel GAA FET shown in FIG. 17A, the etching byproduct 33 is removed more in the wide width channel GAA FET than the narrow width channel GAA FET. Accordingly, as shown in FIGS. 18A and 18B, different amounts of the first insulating layer 30 remains in the source/drain space 21 of the first GAA FET and the second GAA FET. In some embodiments, the thickness of the remaining first insulating layer 30 at the bottom of the source/drain space 21 is in a range from about 2 nm to about 5 nm for the second GAA FET and is in a range from about 1 nm to about 4 nm for the first GAA FET. In some embodiments, a cleaning operation to remove the polymer 33 is performed before the source/drain epitaxial layer is formed.

In some embodiments, the remaining first insulating layer 30 is continuous between one or more of the inner spacers 35 and discontinuous between one or more of the inner spacers, as shown in FIGS. 18A and 18B.

Figure 19A:
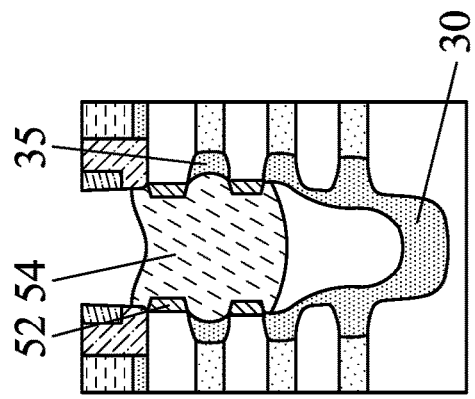
FIGS. 19A and 19B show one of the various stages of a sequential manufacturing process of a semiconductor GAA FET device according to an embodiment of the present disclosure.
Figure 19B:
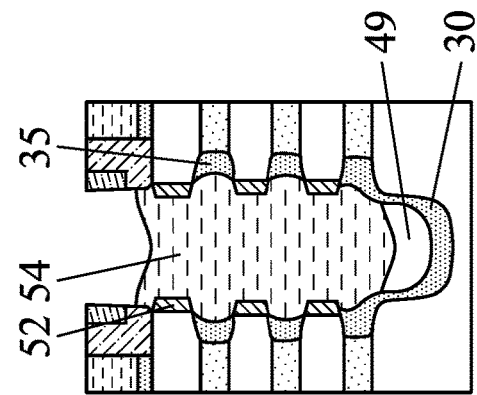

After the inner spacers 35 are formed, similar to FIGS. 11A and 11B, one or more source/drain epitaxial layers are formed in the source/drain space 21, as shown in FIGS. 19A and 19B. As shown in FIG. 19A, in the first GAA FET having a narrow channel width, two second semiconductor layers 25 are connected to the source/drain epitaxial layers, and thus function as channels of a FET. On the other hand, as shown in FIG. 19B, in the second GAA FET having a wide channel width, three second semiconductor layers 25 are connected to the source/drain epitaxial layers, and thus function as the channels of a FET. As such, the second GAA FET has a greater on-current than the first GAA FET not only due to the different in channel width but also due to the difference in number of nano sheets or wires.

Moreover, since the air gap 49 is formed at the bottom of the source/drain epitaxial layer, it is possible to suppress an off-current of the GAA FETs. In some embodiments, the air gap 49 of the first GAA FET is smaller in volume or in height than the air gap 49 of the second GAA FET.

In the foregoing embodiments, the etching amount of the first insulating layer depends on the area of the source/drain region (e.g., a width of the fin structure) and thus it is possible to select a desired number of nano sheets or wires that are in (direct) contact with the source/drain epitaxial layer, thereby controlling an on-current value within a semiconductor device.

It will be understood that not all advantages have been necessarily discussed herein, no particular advantage is required for all embodiments or examples, and other embodiments or examples may offer different advantages.

According to some embodiments of the present disclosure, in a method of manufacturing a semiconductor device, a fin structure in which first semiconductor layers and second semiconductor layers are alternately stacked is formed over a substrate, a sacrificial gate structure is formed over the fin structure, a source/drain region of the fin structure, which is not covered by the sacrificial gate structure, is etched thereby forming a source/drain space, ends of the first semiconductor layers is laterally etched in the source/drain space, an insulating layer is formed on a sidewall of the source/drain space, the insulating layer is partially etched, thereby forming one or more inner spacers on an etched end face of each of one or more first semiconductor layers and leaving a part of the insulating layer as a remaining insulating layer, and a source/drain epitaxial layer is formed in the source/drain space. After the source/drain epitaxial layer is formed, an end face of at least one of the second semiconductor layers is covered by the remaining insulating layer. In one or more of the foregoing or following embodiments, an air gap is formed below the source/drain epitaxial layer and the remaining insulating layer. In one or more of the foregoing or following embodiments, one of the inner spacers formed on an end face of a bottommost one of the first semiconductor layer and the remaining insulating layer at a bottom of the source/drain space are continuous. In one or more of the foregoing or following embodiments, after the source/drain epitaxial layer is formed, end faces of at least two of the second semiconductor layers from a bottom are covered by the remaining insulating layer. In one or more of the foregoing or following embodiments, two of the inner spacers formed on end faces of two of the first semiconductor layer from a bottom and the remaining insulating layer at a bottom of the source/drain space are continuous.

According to one aspect of the present disclosure, in a method of manufacturing a semiconductor device, a first fin structure and a second fin structure, in each of which first semiconductor layers and second semiconductor layers are alternately stacked, are formed over a substrate, sacrificial gate structures are formed over the first fin structure and the second fin structure, a first source/drain region of the first fin structure, which is not covered by the sacrificial gate structures, is etched thereby forming a first source/drain space, and a second source/drain region of the second fin structure, which is not covered by the sacrificial gate structures, is etched thereby forming a second source/drain space, ends of the first semiconductor layers are laterally etched in the first source/drain space and in the second source/drain space, respectively, an insulating layer is formed on a sidewall of the first source/drain space and on a sidewall of the second source/drain space, respectively, the insulating layer is partially etched, thereby forming one or more inner spacers on an etched end face of each of one or more first semiconductor layers and leaving a part of the insulating layer as a remaining insulating layer in the first source/drain space and in the second source/drain space, respectively, and a first source/drain epitaxial layer is formed in the first source/drain space and a second source/drain epitaxial layer is formed in the second source/drain space. After the first source/drain epitaxial layer is formed, an end face of at least one of the second semiconductor layers is covered by the remaining insulating layer in the first source/drain space. In one or more of the foregoing or following embodiments, an area of the first source/drain region in plan view is smaller than an area of the second source/drain region in plan view. In one or more of the foregoing or following embodiments, a width of the first fin structure is smaller than a width of the second fin structure. In one or more of the foregoing or following embodiments, after the second source/drain epitaxial layer is formed, an end face of none of the second semiconductor layers is covered by the remaining insulating layer in the second source/drain space. In one or more of the foregoing or following embodiments, after the first source/drain epitaxial layer is formed, end faces of two of the second semiconductor layers are covered by the remaining insulating layer in the first source/drain space. In one or more of the foregoing or following embodiments, after the second source/drain epitaxial layer is formed, an end face of one of the second semiconductor layers is covered by the remaining insulating layer in the second source/drain space. In one or more of the foregoing or following embodiments, two of the inner spacers formed on end faces of two of the first semiconductor layer from a bottom and the remaining insulating layer at a bottom of the first source/drain space are continuous. In one or more of the foregoing or following embodiments, a first air gap is formed below the first source/drain epitaxial layer and the remaining insulating layer in the first source/drain space, and a second air gap is formed below the second source/drain epitaxial layer and the remaining insulating layer in the second source/drain space. In one or more of the foregoing or following embodiments, the first air gap is smaller in volume or in height than the second air gap. In one or more of the foregoing or following embodiments, one of the inner spacers formed on an end face of a bottommost one of the first semiconductor layer and the remaining insulating layer at a bottom of the first source/drain space are continuous in the first source/drain space. In one or more of the foregoing or following embodiments, during or after partially etching the insulating layer, a polymer layer is formed in the first and second source/drain spaces.

In accordance with another aspect of the present disclosure, in a method of manufacturing a semiconductor device, a fin structure in which first semiconductor layers and second semiconductor layers are alternately stacked, is formed over a substrate, a sacrificial gate structure is formed over the fin structure, a source/drain region of the fin structure, which is not covered by the sacrificial gate structure, is etched thereby forming a source/drain space, ends of the first semiconductor layers are laterally etched in the source/drain space, an insulating layer is formed on a sidewall of the source/drain space, the insulating layer is partially etched, thereby forming one or more inner spacers on an etched end face of each of one or more first semiconductor layers and leaving a part of the insulating layer as a remaining insulating layer, and a source/drain epitaxial layer is formed in the source/drain space. After the source/drain epitaxial layer is formed, an end face of a bottommost one of the first semiconductor layers and a bottom of the source/drain space are continuously covered by the remaining insulating layer. In one or more of the foregoing or following embodiments, an air gap is formed below the source/drain epitaxial layer and the remaining insulating layer. In one or more of the foregoing or following embodiments, after the source/drain epitaxial layer is formed, an end face of none of the second semiconductor layers is covered by the remaining insulating layer in the source/drain space. In one or more of the foregoing or following embodiments, after the source/drain epitaxial layer is formed, an end face of at least one of the second semiconductor layers is covered by the remaining insulating layer in the source/drain space.

In accordance with another aspect of the present disclosure, a semiconductor device includes a first gate-all-around field effect transistor (GAA FET) and a second GAA FET. Each of the first GAA FET and the second GAA FET includes semiconductor nano sheets or nano wires disposed over and vertically arranged over a substrate, a gate structure, and a source/drain epitaxial layer. A number of the semiconductor nano sheets or nano wires in contact with the source/drain epitaxial layer in the first GAA FET is smaller than a number of the semiconductor nano sheets or nano wires in contact with the source/drain epitaxial layer in the second GAA FET. An air gap is disposed below the source/drain epitaxial layer in the first and second GAA FETs. In one or more of the foregoing or following embodiments, the air gap of the first GAA FET is smaller in volume or in height than the air gap of the second GAA FET. In one or more of the foregoing or following embodiments, an area of the source/drain region in plan view of the first GAA FET is smaller than an area of the source/drain region in plan view of the second GAA FET. In one or more of the foregoing or following embodiments, a channel width of the first GAA FET is smaller than a channel width of the second GAA FET. In one or more of the foregoing or following embodiments, each of the first GAA FET and the second GAA FET further includes inner spacers between the source/drain epitaxial layer and the gate structure, and a bottom insulating layer disposed below the air gap. A bottommost one of the inner spacers and the bottom insulating layer are continuous. In one or more of the foregoing or following embodiments, in the first GAA FET, two of the inner spacers from a bottom and the bottom insulating layer are continuous, and in the second GAA FET, a second inner spacer from a bottom is separated from the bottom insulating layer. In one or more of the foregoing or following embodiments, a different between the number of the semiconductor nano sheets or nano wires in contact with the source/drain epitaxial layer in the first GAA FET and the number of the semiconductor nano sheets or nano wires in contact with the source/drain epitaxial layer in the second GAA FET is one.

In accordance with another aspect of the present disclosure, a semiconductor device includes semiconductor nano sheets or nano wires disposed over and vertically arranged over a substrate, a gate structure, a source/drain epitaxial layer, inner spacers disposed between the semiconductor nano sheets or nano wires and the source/drain epitaxial layer, and an air gap disposed below the source/drain epitaxial layer. At least one of the semiconductor nano sheets or nano wires is not connected to the source/drain epitaxial layer. In one or more of the foregoing or following embodiments, the semiconductor device further includes a bottom insulating layer disposed below the air gap. A bottommost one of the inner spacers and the bottom insulating layer are continuous. In one or more of the foregoing or following embodiments, a channel width of the semiconductor nano sheets or nano wires is in a range from 10 nm to 30 nm. In one or more of the foregoing or following embodiments, two of the semiconductor nano sheets or nano wires are not connected to the source/drain epitaxial layer. In one or more of the foregoing or following embodiments, the semiconductor device further includes a bottom insulating layer disposed below the air gap. Two inner spacers from a bottom and the bottom insulating layer are continuous. In one or more of the foregoing or following embodiments, a channel width of the semiconductor nano sheets or nano wires is in a range from 5 nm to 25 nm. In one or more of the foregoing or following embodiments, the source/drain epitaxial layer includes a first layer disposed on end faces of the semiconductor nano sheets or nano wires and a second layer disposed over the first layer and in contact with one or more the inner spacers.

In accordance with another aspect of the present disclosure, a semiconductor device includes a first gate-all-around field effect transistor (GAA FET) and a second GAA FET having a higher on-current than the first GAA FET. Each of the first GAA FET and the second GAA FET includes semiconductor nano sheets or nano wires disposed over and vertically arranged over a substrate, a gate structure, a source/drain epitaxial layer, and an air gap disposed below the source/drain epitaxial layer in the first and second GAA FETs. An area of the source/drain region in plan view of the first GAA FET is smaller than an area of the source/drain region in plan view of the second GAA FET. In one or more of the foregoing or following embodiments, the air gap of the first GAA FET is smaller in volume or in height than the air gap of the second GAA FET. In one or more of the foregoing or following embodiments, a channel width of the first GAA FET is smaller than a channel width of the second GAA FET. In one or more of the foregoing or following embodiments, at least one of the semiconductor nano sheets or nano wires in the first GAA FET is not connected to the source/drain epitaxial layer. In one or more of the foregoing or following embodiments, all of the semiconductor nano sheets or nano wires in the second GAA FET are connected to the source/drain epitaxial layer. In one or more of the foregoing or following embodiments, each of the first GAA FET and the second GAA FET further includes a bottom insulating layer disposed below the air gap, and a bottommost one of the inner spacers and the bottom insulating layer are continuous.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a fin structure in which first semiconductor layers and second semiconductor layers are alternately stacked over a substrate;
    forming a sacrificial gate structure over the fin structure;
    etching a source/drain region of the fin structure, which is not covered by the sacrificial gate structure, thereby forming a source/drain space;
    laterally etching ends of the first semiconductor layers in the source/drain space;
    forming an insulating layer on a sidewall of the source/drain space;
    partially etching the insulating layer, thereby forming one or more inner spacers on an etched end face of each of one or more first semiconductor layers and leaving a part of the insulating layer as a remaining insulating layer; and
    forming a source/drain epitaxial layer in the source/drain space,
    wherein after the source/drain epitaxial layer is formed, an end face of at least one of the second semiconductor layers is covered by the remaining insulating layer.

2. The method of claim 1, wherein an air gap is formed below the source/drain epitaxial layer and the remaining insulating layer.

3. The method of claim 1, wherein one of the inner spacers formed on an end face of a bottommost one of the first semiconductor layers and the remaining insulating layer at a bottom of the source/drain space are continuous.

4. The method of claim 1, wherein after the source/drain epitaxial layer is formed, end faces of at least two of the second semiconductor layers from a bottom are covered by the remaining insulating layer.

5. The method of claim 4, wherein two of the inner spacers formed on end faces of two of the first semiconductor layers from a bottom and the remaining insulating layer at a bottom of the source/drain space are continuous.

6. A method of manufacturing a semiconductor device, comprising:
- forming a first fin structure and a second fin structure, in each of which first semiconductor layers and second semiconductor layers are alternately stacked over a substrate;
- forming sacrificial gate structures over the first fin structure and the second fin structure;
- etching a first source/drain region of the first fin structure, which is not covered by the sacrificial gate structures, thereby forming a first source/drain space, and etching a second source/drain region of the second fin structure, which is not covered by the sacrificial gate structures, thereby forming a second source/drain space;
- laterally etching ends of the first semiconductor layers in the first source/drain space and in the second source/drain space, respectively;
- forming an insulating layer on a sidewall of the first source/drain space and on a sidewall of the second source/drain space, respectively;
- partially etching the insulating layer, thereby forming one or more inner spacers on an etched end face of each of one or more first semiconductor layers and leaving a part of the insulating layer as a remaining insulating layer in the first source/drain space and in the second source/drain space, respectively; and
- forming a first source/drain epitaxial layer in the first source/drain space and a second source/drain epitaxial layer in the second source/drain space,
- wherein after the first source/drain epitaxial layer is formed, an end face of at least one of the second semiconductor layers is covered by the remaining insulating layer in the first source/drain space.

7. The method of claim 6, wherein an area of the first source/drain region in plan view is smaller than an area of the second source/drain region in plan view.

8. The method of claim 7, wherein a width of the first fin structure is smaller than a width of the second fin structure.

9. The method of claim 7, wherein after the second source/drain epitaxial layer is formed, an end face of none of the second semiconductor layers is covered by the remaining insulating layer in the second source/drain space.

10. The method of claim 9, wherein during or after partially etching the insulating layer, a polymer layer is formed in the first and second source/drain spaces.

11. The method of claim 7, wherein:
after the first source/drain epitaxial layer is formed, end faces of two of the second semiconductor layers are covered by the remaining insulating layer in the first source/drain space.

12. The method of claim 11, wherein after the second source/drain epitaxial layer is formed, an end face of one of the second semiconductor layers is covered by the remaining insulating layer in the second source/drain space.

13. The method of claim 11, wherein two of the inner spacers formed on end faces of two of the first semiconductor layers from a bottom of the first source/drain space and the remaining insulating layer at the bottom of the first source/drain space are continuous.

14. The method of claim 11, wherein one of the inner spacers formed on an end face of a bottommost one of the first semiconductor layers and the remaining insulating layer at a bottom of the first source/drain space are continuous in the first source/drain space.

15. The method of claim 7, wherein:
- a first air gap is formed below the first source/drain epitaxial layer and the remaining insulating layer in the first source/drain space, and
- a second air gap is formed below the second source/drain epitaxial layer and the remaining insulating layer in the second source/drain space.

16. The method of claim 15, wherein the first air gap is smaller in volume or in height than the second air gap.

17. A method of manufacturing a semiconductor device, comprising:
- forming a first fin structure and a second fin structure, the first and second fin structures including first semiconductor layers and second semiconductor layers are alternately stacked;
- forming first and second gate structures over the first and second fin structures;
- etching a first source/drain region of the first fin structure to form a first source/drain space, and etching a second source/drain region of the second fin structure to form a second source/drain space;
- forming an insulating layer on a sidewall of the first source/drain space and on a sidewall of the second source/drain space;
- etching the insulating layer to form one or more inner spacers on an etched end face of the first semiconductor layers and leaving a part of the insulating layer as a remaining insulating layer in the first source/drain space and in the second source/drain space; and
- forming a first source/drain epitaxial layer in the first source/drain space and a second source/drain epitaxial layer in the second source/drain space,
- wherein after the first source/drain epitaxial layer is formed, an end face of a bottom-most one of the first semiconductor layers and a bottom of the first source/drain space are continuously covered by the remaining insulating layer.

18. The method of claim 17, wherein a first air gap is formed below the first source/drain epitaxial layer and a second air gap is formed below the second source/drain epitaxial layer.

19. The method of claim 17, wherein after the second source/drain epitaxial layer is formed, an end face of none of the second semiconductor layers is covered by the remaining insulating layer in the second source/drain space.

20. The method of claim 17, wherein after the first source/drain epitaxial layer is formed, an end face of at least one of the second semiconductor layers is covered by the remaining insulating layer in the first source/drain space.

* * * * *